US008721790B2

(12) United States Patent
Kato et al.

(10) Patent No.: US 8,721,790 B2
(45) Date of Patent: *May 13, 2014

(54) FILM DEPOSITION APPARATUS

(75) Inventors: Hitoshi Kato, Iwate (JP); Manabu Honma, Iwate (JP); Kohichi Orito, Iwate (JP); Yasushi Takeuchi, Iwate (JP); Hiroyuki Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 203 days.

This patent is subject to a terminal disclaimer.

(21) Appl. No.: 12/963,673

(22) Filed: Dec. 9, 2010

(65) Prior Publication Data

US 2011/0139074 A1 Jun. 16, 2011

(30) Foreign Application Priority Data

Dec. 10, 2009 (JP) ................................. 2009-280869

(51) Int. Cl.
*C23C 16/453* (2006.01)
*C23C 16/455* (2006.01)
*C23C 16/458* (2006.01)
*H01L 21/306* (2006.01)
*C23F 1/00* (2006.01)
*C23C 16/06* (2006.01)
*C23C 16/22* (2006.01)

(52) U.S. Cl.
USPC ........... 118/715; 118/719; 118/728; 118/729; 118/730; 156/345.29; 156/345.31; 156/345.33; 156/345.54; 156/345.55

(58) Field of Classification Search
USPC .................... 118/715, 719, 728, 729, 730; 156/345.29, 345.31, 345.33, 345.54, 156/345.55

See application file for complete search history.

(56) References Cited

U.S. PATENT DOCUMENTS

| | | | | |
|---|---|---|---|---|
| 4,681,773 A | * | 7/1987 | Bean | 427/255.5 |
| 4,879,970 A | * | 11/1989 | Barkalow et al. | 118/719 |
| 5,095,300 A | * | 3/1992 | Alexander et al. | 340/686.5 |
| 5,266,119 A | * | 11/1993 | Taniguchi et al. | 118/730 |
| 5,302,209 A | * | 4/1994 | Maeda et al. | 118/719 |
| 5,314,574 A | * | 5/1994 | Takahashi | 438/706 |
| 5,338,362 A | * | 8/1994 | Imahashi | 118/719 |
| 5,540,821 A | * | 7/1996 | Tepman | 204/192.13 |
| 5,807,792 A | * | 9/1998 | Ilg et al. | 438/758 |
| 5,849,088 A | * | 12/1998 | DeDontney et al. | 118/719 |

(Continued)

FOREIGN PATENT DOCUMENTS

| | | | | |
|---|---|---|---|---|
| JP | 63-000112 | | 1/1988 | |
| JP | 05259332 A | * | 10/1993 | H01L 23/473 |

(Continued)

*Primary Examiner* — Rudy Zervigon
(74) *Attorney, Agent, or Firm* — IPUSA, PLLC

(57) ABSTRACT

A film deposition apparatus includes a turntable provided in the chamber and having on a first surface a substrate receiving area in which a substrate is placed; first and second reaction gas supplying portions supplying first and second reaction gases to the first surface, respectively; a separation gas supplying portion provided between the first reaction gas supplying portion and the second reaction gas supplying portion and supplying a separation gas that separates the first reaction gas and the second reaction gas; an evacuation port that evacuates the chamber; a space defining member provided for at least one of the first and second reaction gas supplying portions and defining a first space between the at least one of the first and second reaction gas supplying portions and the turntable and a second space so that the separation gas is likely to flow through the second space rather than the first space.

16 Claims, 32 Drawing Sheets

(56) References Cited

U.S. PATENT DOCUMENTS

| | | | |
|---|---|---|---|
| 5,855,681 A * | 1/1999 | Maydan et al. | 118/719 |
| 5,902,088 A * | 5/1999 | Fairbairn et al. | 414/217 |
| 5,909,994 A * | 6/1999 | Blum et al. | 414/217 |
| 5,911,834 A * | 6/1999 | Fairbairn et al. | 134/1.3 |
| 6,120,609 A * | 9/2000 | Selyutin et al. | 118/728 |
| 6,143,082 A * | 11/2000 | McInerney et al. | 118/719 |
| 6,203,619 B1 * | 3/2001 | McMillan | 118/719 |
| 6,235,656 B1 * | 5/2001 | Clarke | 438/800 |
| 6,319,553 B1 * | 11/2001 | McInerney et al. | 427/250 |
| 6,413,321 B1 * | 7/2002 | Kim et al. | 118/725 |
| 6,474,986 B2 * | 11/2002 | Oda et al. | 432/247 |
| 6,562,141 B2 * | 5/2003 | Clarke | 118/719 |
| 6,591,850 B2 * | 7/2003 | Rocha-Alvarez et al. | 137/9 |
| 6,634,314 B2 * | 10/2003 | Hwang et al. | 118/723 R |
| 6,635,115 B1 * | 10/2003 | Fairbairn et al. | 118/719 |
| 6,696,108 B2 * | 2/2004 | Murayama et al. | 427/569 |
| 6,752,874 B2 * | 6/2004 | Shim et al. | 118/719 |
| 6,812,157 B1 * | 11/2004 | Gadgil | 438/763 |
| 6,843,882 B2 * | 1/2005 | Janakiraman et al. | 156/345.29 |
| 6,869,641 B2 | 3/2005 | Schmitt | |
| 6,872,421 B2 * | 3/2005 | Hwang et al. | 427/248.1 |
| 6,962,644 B2 * | 11/2005 | Paterson et al. | 156/345.28 |
| 6,972,055 B2 * | 12/2005 | Sferlazzo | 118/719 |
| 7,052,576 B2 * | 5/2006 | Park et al. | 156/345.24 |
| 7,153,542 B2 * | 12/2006 | Nguyen et al. | 427/248.1 |
| 7,276,122 B2 * | 10/2007 | Devine et al. | 118/719 |
| 7,422,636 B2 * | 9/2008 | Ishizaka | 118/719 |
| 7,566,891 B2 * | 7/2009 | Rocha-Alvarez et al. | 250/504 R |
| 7,589,336 B2 * | 9/2009 | Kaszuba et al. | 250/504 R |
| 7,655,092 B2 * | 2/2010 | Fairbairn et al. | 118/719 |
| 7,663,121 B2 * | 2/2010 | Nowak et al. | 250/455.11 |
| 7,763,115 B2 * | 7/2010 | Hatanaka et al. | 118/719 |
| 7,777,198 B2 * | 8/2010 | Rocha-Alvarez et al. | 250/455.11 |
| 7,794,546 B2 * | 9/2010 | Li | 118/733 |
| 7,828,900 B2 * | 11/2010 | Hatanaka et al. | 118/719 |
| 7,861,668 B2 * | 1/2011 | Toyoda et al. | 118/723 E |
| 7,909,595 B2 * | 3/2011 | Kaszuba et al. | 425/174.4 |
| 7,964,858 B2 * | 6/2011 | Yang et al. | 250/504 R |
| 8,020,514 B2 * | 9/2011 | Toyoda et al. | 118/723 E |
| 8,034,723 B2 * | 10/2011 | Ohizumi et al. | 438/758 |
| 8,043,432 B2 * | 10/2011 | Dip | 118/719 |
| 8,066,815 B2 * | 11/2011 | Devine et al. | 118/719 |
| 8,093,072 B2 * | 1/2012 | Ishimaru | 438/14 |
| 8,176,871 B2 * | 5/2012 | Okuda et al. | 118/723 E |
| 8,187,679 B2 * | 5/2012 | Dickey et al. | 427/569 |
| 8,197,636 B2 * | 6/2012 | Shah et al. | 156/345.32 |
| 2001/0007244 A1 * | 7/2001 | Matsuse | 118/719 |
| 2002/0000194 A1 * | 1/2002 | Clarke | 118/715 |
| 2002/0034595 A1 * | 3/2002 | Tometsuka | 427/569 |
| 2002/0056414 A1 * | 5/2002 | Shim et al. | 118/719 |
| 2002/0088547 A1 * | 7/2002 | Tomoyasu et al. | 156/345.47 |
| 2003/0139035 A1 * | 7/2003 | Yim et al. | 438/643 |
| 2004/0025786 A1 * | 2/2004 | Kontani et al. | 118/715 |
| 2004/0052972 A1 * | 3/2004 | Schmitt | 427/569 |
| 2004/0055636 A1 * | 3/2004 | Rocha-Alvarez et al. | 137/9 |
| 2004/0187784 A1 * | 9/2004 | Sferlazzo | 118/719 |
| 2005/0084610 A1 * | 4/2005 | Selitser | 427/248.1 |
| 2005/0241579 A1 * | 11/2005 | Kidd | 118/715 |
| 2005/0247265 A1 * | 11/2005 | Devine et al. | 118/719 |
| 2005/0268852 A1 * | 12/2005 | Hatanaka et al. | 118/723 VE |
| 2006/0073276 A1 | 4/2006 | Antonissen | |
| 2006/0124058 A1 * | 6/2006 | Sakai et al. | 118/715 |
| 2006/0177579 A1 * | 8/2006 | Shin et al. | 427/248.1 |
| 2006/0213439 A1 * | 9/2006 | Ishizaka | 118/715 |
| 2006/0249175 A1 * | 11/2006 | Nowak et al. | 134/1 |
| 2006/0251827 A1 * | 11/2006 | Nowak et al. | 427/558 |
| 2006/0260544 A1 * | 11/2006 | Toyoda et al. | 118/715 |
| 2007/0116873 A1 * | 5/2007 | Li et al. | 427/248.1 |
| 2007/0209590 A1 * | 9/2007 | Li | 118/719 |
| 2007/0212484 A1 * | 9/2007 | Li | 427/248.1 |
| 2007/0218702 A1 * | 9/2007 | Shimizu et al. | 438/758 |
| 2007/0286963 A1 * | 12/2007 | Rocha-Alvarez et al. | 427/508 |
| 2008/0026162 A1 * | 1/2008 | Dickey et al. | 427/569 |
| 2008/0075858 A1 * | 3/2008 | Koh | 427/255.28 |
| 2008/0096369 A1 | 4/2008 | Strzyzewski et al. | |
| 2008/0121180 A1 * | 5/2008 | Kontani et al. | 118/723 R |
| 2008/0193643 A1 | 8/2008 | Dip | |
| 2008/0202423 A1 * | 8/2008 | Hatanaka et al. | 118/723 VE |
| 2008/0241384 A1 | 10/2008 | Jeong et al. | 427/255.29 |
| 2008/0251014 A1 * | 10/2008 | Kontani et al. | 118/715 |
| 2008/0251015 A1 * | 10/2008 | Kontani et al. | 118/715 |
| 2008/0286980 A1 * | 11/2008 | Ishimaru | 438/716 |
| 2009/0074984 A1 * | 3/2009 | Shimizu et al. | 427/569 |
| 2009/0151632 A1 * | 6/2009 | Okuda et al. | 118/666 |
| 2009/0255468 A1 * | 10/2009 | Yamamoto et al. | 118/723 E |
| 2009/0304924 A1 | 12/2009 | Gadgil | |
| 2009/0324826 A1 * | 12/2009 | Kato et al. | 427/255.28 |
| 2009/0324828 A1 * | 12/2009 | Kato et al. | 427/255.28 |
| 2010/0050942 A1 * | 3/2010 | Kato et al. | 118/730 |
| 2010/0050943 A1 * | 3/2010 | Kato et al. | 118/730 |
| 2010/0050944 A1 * | 3/2010 | Kato et al. | 118/730 |
| 2010/0055297 A1 * | 3/2010 | Kato et al. | 427/8 |
| 2010/0055312 A1 * | 3/2010 | Kato et al. | 427/255.26 |
| 2010/0055314 A1 * | 3/2010 | Kato et al. | 427/255.28 |
| 2010/0055315 A1 * | 3/2010 | Honma | 427/255.28 |
| 2010/0055316 A1 * | 3/2010 | Honma | 427/255.28 |
| 2010/0055317 A1 * | 3/2010 | Kato et al. | 427/255.28 |
| 2010/0055319 A1 * | 3/2010 | Kato et al. | 427/255.28 |
| 2010/0055320 A1 * | 3/2010 | Honma | 427/255.28 |
| 2010/0055351 A1 * | 3/2010 | Kato et al. | 427/595 |
| 2010/0116210 A1 * | 5/2010 | Kato et al. | 118/730 |
| 2010/0122710 A1 * | 5/2010 | Kato et al. | 134/1 |
| 2010/0124610 A1 * | 5/2010 | Aikawa et al. | 427/255.28 |
| 2010/0130009 A1 * | 5/2010 | Ishimaru | 438/680 |
| 2010/0132614 A1 * | 6/2010 | Kato et al. | 118/723 R |
| 2010/0132615 A1 * | 6/2010 | Kato et al. | 118/725 |
| 2010/0136795 A1 * | 6/2010 | Honma | 438/758 |
| 2010/0151131 A1 * | 6/2010 | Obara et al. | 427/255.28 |
| 2010/0227046 A1 * | 9/2010 | Kato et al. | 427/10 |
| 2010/0227059 A1 * | 9/2010 | Kato et al. | 427/255.28 |
| 2010/0229797 A1 * | 9/2010 | Kato et al. | 118/730 |
| 2010/0260935 A1 * | 10/2010 | Kato et al. | 427/255.28 |
| 2010/0260936 A1 * | 10/2010 | Kato et al. | 427/255.28 |
| 2010/0275848 A1 * | 11/2010 | Fukuda et al. | 118/728 |
| 2010/0291319 A1 * | 11/2010 | Yamashita et al. | 427/575 |
| 2011/0100489 A1 * | 5/2011 | Orito et al. | 137/560 |
| 2011/0126985 A1 * | 6/2011 | Ohizumi et al. | 156/345.55 |
| 2011/0139074 A1 * | 6/2011 | Kato et al. | 118/730 |
| 2011/0151122 A1 * | 6/2011 | Kato et al. | 427/255.23 |
| 2011/0155056 A1 * | 6/2011 | Kato et al. | 118/719 |
| 2011/0159187 A1 * | 6/2011 | Kato et al. | 427/255.26 |
| 2011/0159702 A1 * | 6/2011 | Ohizumi et al. | 438/778 |
| 2011/0203524 A1 * | 8/2011 | Uno | 118/730 |
| 2012/0075460 A1 * | 3/2012 | Aikawa et al. | 348/87 |
| 2012/0094011 A1 * | 4/2012 | Hishiya et al. | 427/8 |

FOREIGN PATENT DOCUMENTS

| | | | |
|---|---|---|---|
| JP | 2001-254181 | | 9/2001 |
| JP | 2006057162 A | * | 3/2006 |
| JP | 2008-509547 A | | 3/2008 |
| JP | 2008-516428 | | 5/2008 |
| JP | 2009-531535 A | | 9/2009 |
| JP | 2010056477 A | * | 3/2010 |
| JP | 2010059495 A | * | 3/2010 |
| JP | 2010059496 A | * | 3/2010 |
| JP | 2010059498 A | * | 3/2010 |
| JP | 2010059499 A | * | 3/2010 |
| JP | 2010062370 A | * | 3/2010 |
| JP | 2010062371 A | * | 3/2010 |
| JP | 2010080924 A | * | 4/2010 |
| JP | 2010087467 A | * | 4/2010 |
| JP | 2010135420 A | * | 6/2010 |
| JP | 2010153805 A | * | 7/2010 |
| JP | 2010206025 A | * | 9/2010 |
| JP | 2010212627 A | * | 9/2010 |
| JP | 2010219125 A | * | 9/2010 |
| JP | 2010239102 A | * | 10/2010 |
| JP | 2010245448 A | * | 10/2010 |
| JP | 2010263245 A | * | 11/2010 |
| JP | 2011103495 A | * | 5/2011 |
| JP | 2011103496 A | * | 5/2011 |
| JP | 2011119408 A | * | 6/2011 |

(56) References Cited

FOREIGN PATENT DOCUMENTS

| JP | 2011124384 | A | * | 6/2011 |
| JP | 2011134996 | A | * | 7/2011 |
| JP | 2011135003 | A | * | 7/2011 |
| KR | 10-2009-0118951 | | | 11/2009 |
| WO | WO 2006-042074 | | | 4/2006 |

* cited by examiner

US 8,721,790 B2

FILM DEPOSITION APPARATUS

CROSS-REFERENCE TO RELATED APPLICATION

This application is based on and claims the benefit of priority of Japanese Patent Application No. 2009-280869, filed on Dec. 10, 2009 with the Japanese Patent Office, the entire contents of which are hereby incorporated by reference.

BACKGROUND OF THE INVENTION

1. Field of the Invention

The present invention relates to a film deposition apparatus for depositing a film on a substrate by carrying out plural cycles of supplying in turn at least two reaction gases to the substrate in order to form plural layers of a reaction product, thereby depositing a thin film.

2. Description of the Related Art

As a film deposition technique in a semiconductor fabrication process, there has been known a film deposition method, in which a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer, and such an alternating adsorption of the gases is repeated plural times, thereby depositing a film on the wafer. This method is called a so-called Atomic Layer Deposition (ALD) or Molecular Layer Deposition (MLD), and is advantageous in that the film thickness can be controlled at higher accuracy by the number of times of supplying in turn the gases, and in that the deposited film can have excellent uniformity over the wafer. Therefore, this deposition method is thought to be promising as a film deposition technique that can address further miniaturization of semiconductor devices.

As such a deposition method, a deposition method using a single-wafer deposition apparatus having a vacuum chamber and a shower head at an upper center portion of the vacuum chamber has been under consideration, in which the reaction gases are introduced into the chamber from the shower head, and unreacted gases and by-products are evacuated from a bottom portion of the vacuum chamber. When such a deposition chamber is used, it takes a long time for a purge gas to purge the reaction gases when the first reaction gas and the second reaction gases are switched, and in addition the number of cycles may reach several hundred, resulting in an extremely long process time. Therefore, a deposition method and apparatus that enable high throughput is desired.

Under these circumstances, film deposition apparatuses have been proposed that include a vacuum chamber, a wafer supporting member (or a turntable) that holds plural wafers along a rotation direction, which is provided in the vacuum chamber, first and second reaction gas nozzles that oppose the wafer supporting member and are arranged at equal angular intervals, and separation gas nozzles that are arranged between the first and the second reaction gas nozzles. In such a deposition apparatus, the first and the second reaction gases are concurrently supplied and the wafer supporting member by which the wafers are supported is rotated, thereby carrying out the film deposition method.

SUMMARY OF THE INVENTION

According to such a turntable-type ALD apparatus, higher throughput may be realized because the needs for switching the first reaction and the second reaction gases and purging the first reaction and the second reaction gases with a purge gas can be eliminated. On the other hand, because the first and the second reaction gases are supplied to the vacuum chamber at the same time, measures to reduce intermixing and gas-phase reaction of the first and the second reaction gases are necessary. In the film deposition apparatus in Patent Document 1, the first and the second reaction gases are separated only by supplying the separation gases from the separation gas nozzles.

However, when the separation gases are used, the first and the second reaction gases may be diluted by the separation gases, so that a relatively large amount of the first and the second reaction gases need to be supplied in order to maintain a sufficient deposition rate.

Patent Document 2 below has disclosed a film deposition apparatus in which a relatively flat gap area is defined above a rotational substrate holder (turntable) in a deposition chamber. In this film deposition apparatus, precursors (reaction gases) are introduced to the gap area and evacuated in an upward direction from suction zones provided in both sides of the gap area, thereby preventing the precursors from being diluted by the separation gases (purge gases).

However, when the precursors are confined in the gap area, thermal decomposition of the precursors, depending on the precursors, may take place, and by-products of the thermal decomposition may be deposited on inner walls of the gap area. Such deposition of the by-products may serve as a particle source, thereby reducing production yield.

Patent Document 1: Japanese Patent Application Laid-Open Publication No. 2001-254181.

Patent Document 2: Published Japanese Translation of PCT International Publication No. 2008-516428 (or corresponding United States Patent Publication No. 2006/0073276).

The present invention has been made in view of the above, and provides a film deposition apparatus in which dilution of a first reaction gas and a second reaction gas, which may be caused by a separation gas that is used to separate the first and the second reaction gases, is reduced, thereby avoiding a reduction of a deposition rate.

According to a first aspect of the present invention, there is provided a film deposition apparatus for depositing a film on a substrate by performing a cycle of alternately supplying at least two kinds of reaction gases that react with each other to the substrate to produce a layer of a reaction product in a chamber. The film deposition apparatus includes a turntable that is rotatably provided in the chamber and has on a first surface a substrate receiving area in which the substrate is placed; a first reaction gas supplying portion that supplies a first reaction gas to the first surface of the turntable; a second reaction gas supplying portion that is provided away from the first reaction gas supplying portion along a rotation direction of the turntable and supplies a second reaction gas to the first surface of the turntable; a separation gas supplying portion that is provided between the first reaction gas supplying portion and the second reaction gas supplying portion and supplies a separation gas that separates the first reaction gas and the second reaction gas; an evacuation port that evacuates the chamber; a space defining member that is provided for at least one of the first reaction gas supplying portion and the second reaction gas supplying portion and defines a first space between the at least one of the first reaction gas supplying portion and the second reaction gas supplying portion and the turntable and a second space so that the separation gas is more likely to flow through the second space rather than the first space.

DETAILED DESCRIPTION OF THE PREFERRED EMBODIMENT

Figure 1:
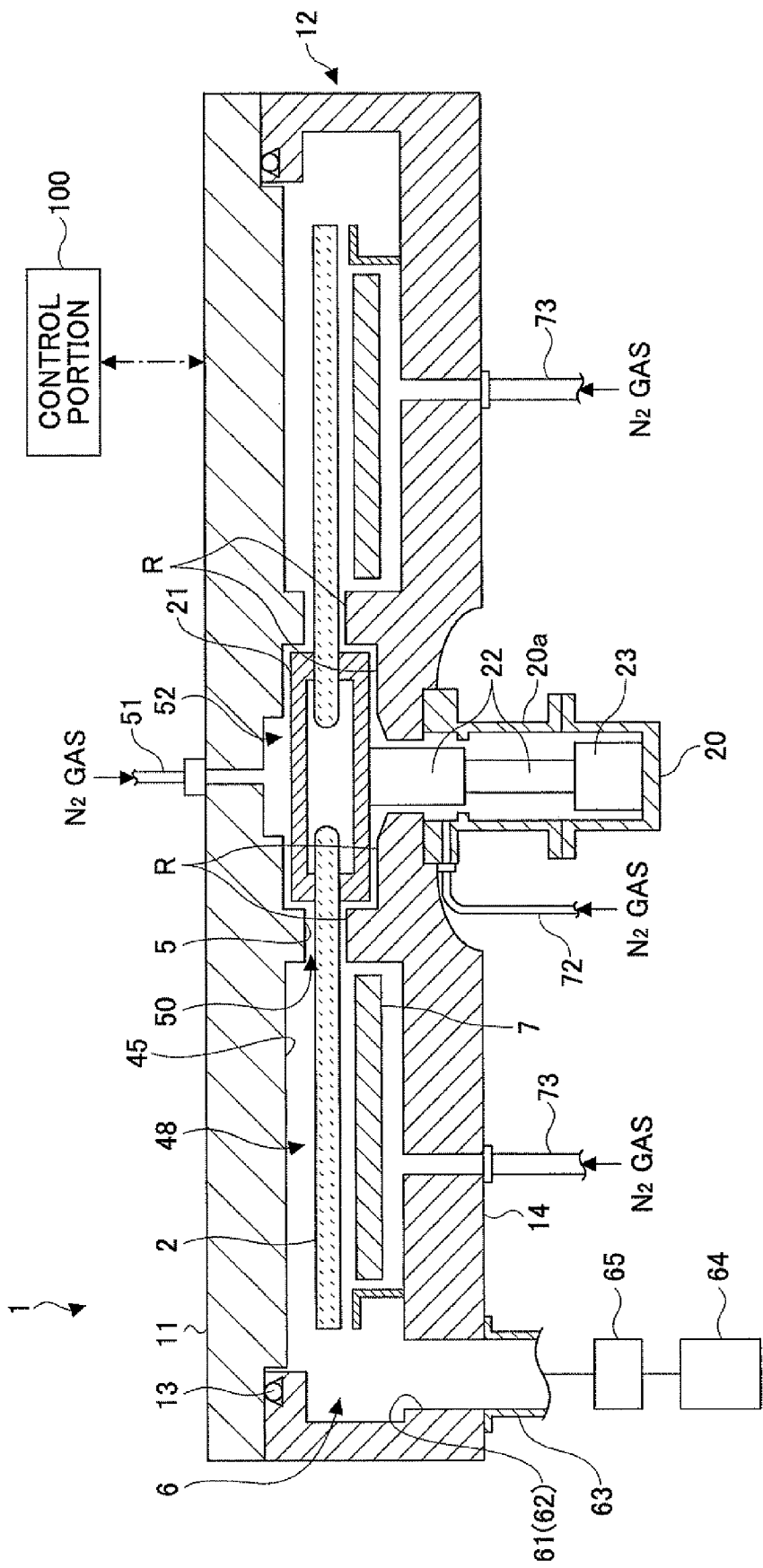
FIG. 1 is a cross-sectional view of a film deposition apparatus according to an embodiment of the present invention.

According to an embodiment of the present invention, there is provided a film deposition apparatus in which dilution of a first reaction gas and a second reaction gas, which may be caused by a separation gas that is used to separate the first and the second reaction gases, is reduced, thereby avoiding a reduction of a deposition rate.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components. Therefore, the specific size should be determined by a person having ordinary skill in the art in view of the following non-limiting embodiments.

Figure 2:
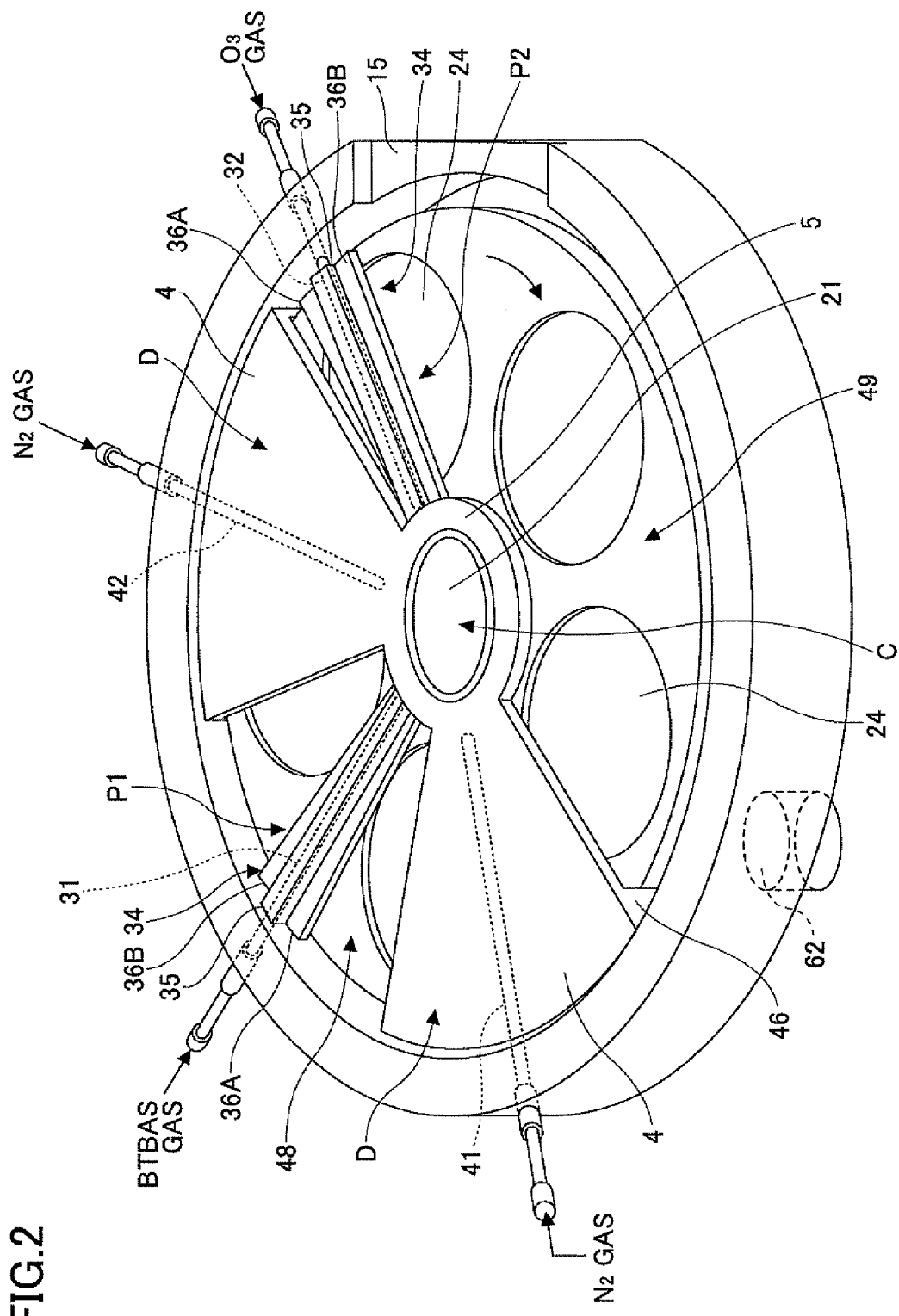
FIG. 2 is a perspective view schematically illustrating an inner configuration of the film deposition apparatus of FIG. 1.

Referring to FIG. 1 (a cross-sectional view taken along I-I line in FIG. 3) and FIG. 2, a film deposition apparatus according to an embodiment of the present invention has a vacuum chamber 1 having a flattened cylinder shape whose top view is substantially circle, and a turntable 2 that is located inside the chamber 1 and has a rotation center at a center of the vacuum chamber 1. The vacuum chamber 1 is made so that a ceiling plate 11 can be separated from a chamber body 12. The ceiling plate 11 is attached onto the chamber body 12 via a sealing member such as an O-ring 13, so that the vacuum chamber 1 is maintained in an air-tight manner. On the other hand, the ceiling plate 11 can be brought upward by a driving mechanism (not shown) when the ceiling plate 11 has to be removed from the chamber body 12. The ceiling plate 11 and the chamber body 12 may be made of, for example, Aluminum (Al).

Referring to FIG. 1, the turntable 2 has a circular opening in the center and is supported in such a manner that a portion around the opening of the turntable 2 is held from above and below by a core portion 21 having a cylindrical shape. The core portion 21 is fixed on a top end of a rotational shaft 22 that extends in a vertical direction. The rotational shaft 22 goes through a bottom portion 14 of the chamber body 12, and is fixed at the lower end to a driving mechanism 23 that can rotate the rotational shaft 22 around a vertical axis. With these configurations, the turntable 2 can be rotated around its center. The rotational shaft 22 and the driving mechanism 23 are housed in a case body 20 having a cylinder with a bottom. The case body 20 is fixed in an air-tight manner to a bottom surface of the bottom portion 14 via a flanged pipe portion 20a, so that an inner environment of the case body 20 is isolated from an outer environment.

Figure 3:
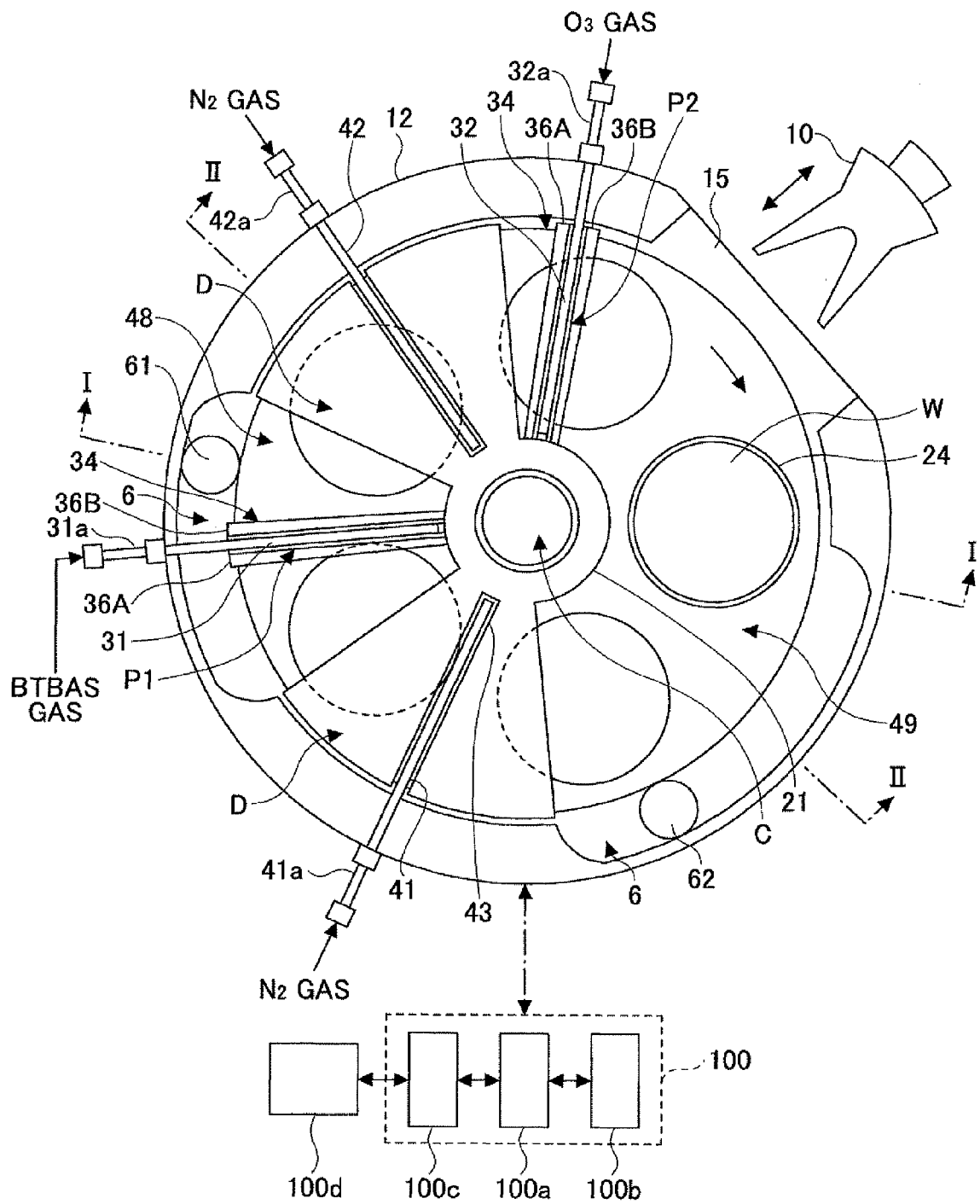
FIG. 3 is a plan view of the film deposition apparatus of FIG. 1.

As shown in FIGS. 2 and 3, plural (five in the illustrated example) circular concave portions 24, each of which receives a wafer W, are formed in the upper surface of the turntable 2, although only one wafer W is illustrated in FIG. 3, for convenience of illustration. The concave portions 24 are arranged at angular intervals of about 72° on the turntable 2.

Figure 4:
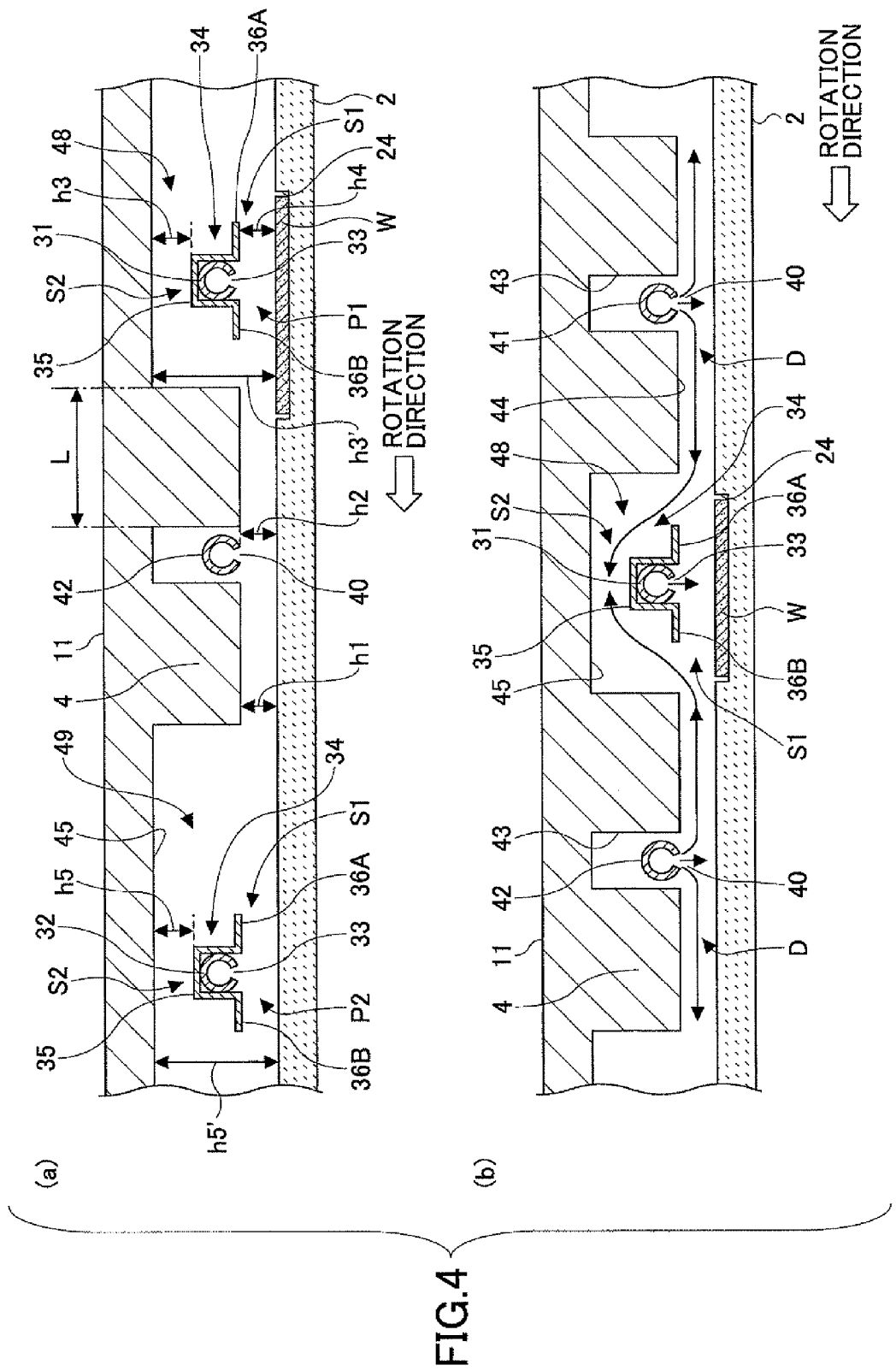
FIG. 4 is a cross-sectional view of the film deposition apparatus of FIG. 1, illustrating process areas and a separation area.

Section (a) of FIG. 4 is a cross-sectional view illustrating the concave portion 24 and the wafer W placed in the concave portion 24. As shown in the drawing, the concave portion 24 has a diameter slightly larger, for example, by 4 mm than the diameter of the wafer W and a depth substantially equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area and the wafer W, gas flow turbulence is caused by the step, which adversely influences across-wafer uniformity of a film thickness. Therefore, it is preferable in order to reduce such influence that the surfaces of the wafer W and the turntable 2 are at the same elevation. While "the same elevation" may mean here that a height difference is less than or equal to about 5 mm, the difference has to be as close to zero as possible to the extent allowed by machining accuracy.

In the bottom of the concave portion 24 there are formed three through holes (not shown) through which three corresponding lift pins (refer to reference symbols 16 in FIG. 9) are moved upward or downward. The lift pins 16 support a back surface of the wafer W and raises/lowers the wafer W, which enables transferring of the wafer from/to a transfer mechanism (refer to a reference symbol 10 in FIG. 9) to/from the concave portion 24.

Referring again to FIGS. 2 and 3, a first reaction gas nozzle 31, a second reaction gas nozzle 32, and separation gas nozzles 41, 42 are arranged at predetermined angular intervals along the circumferential direction of the vacuum chamber 1 and above the turntable 2, and extend in radial directions. In the illustrated example, the second reaction gas nozzle 32, the separation gas nozzle 41, the first reaction gas nozzle 31, and the separation gas nozzle 42 are arranged clockwise in this order when seen from above. Each of the nozzles 31, 32, 41, and 42 penetrates the circumferential wall portion of the chamber body 12 and is supported by attaching their base ends, which are gas inlet ports 31a, 32a, 41a, 42a, respectively, on the outer circumference wall of the circumferential wall portion. Although the reaction gas nozzles 31, 32 and the separation gas nozzles 41, 42 are introduced into the vacuum chamber 1 from the circumferential wall portion of the vacuum chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the vacuum chamber 1 and the gas inlet port 31a (32a, 41a, 42a) can be connected to the other opening of the L-shaped conduit outside the vacuum chamber 1.

Although not shown, the first reaction gas nozzle 31 is connected to a gas supplying source of bis (tertiary-butylamino) silane (BTBAS), which is a first source gas, and the second reaction gas nozzle 32 is connected to a gas supplying source of $O_3$ (ozone) gas, which is a second source gas.

The reaction gas nozzles 31, 32 have plural ejection holes 33 (see FIG. 4) in order to eject the corresponding source gases toward the upper surface of the turntable 2. The plural ejection holes 33 are arranged in longitudinal directions of the reaction gas nozzles 31, 32 at predetermined intervals. The ejection holes 33 have an inner diameter of about 0.5 mm, and are arranged at intervals of about 10 mm in this embodiment. In the following explanation, an area below the reaction gas nozzle 31 may be referred to as a first process area P1 in which the BTBAS gas is adsorbed on the wafer W, and an area below the reaction gas nozzle 32 may be referred to as a second process area P2 in which the $O_3$ gas is adsorbed on the wafer W.

Figure 5:
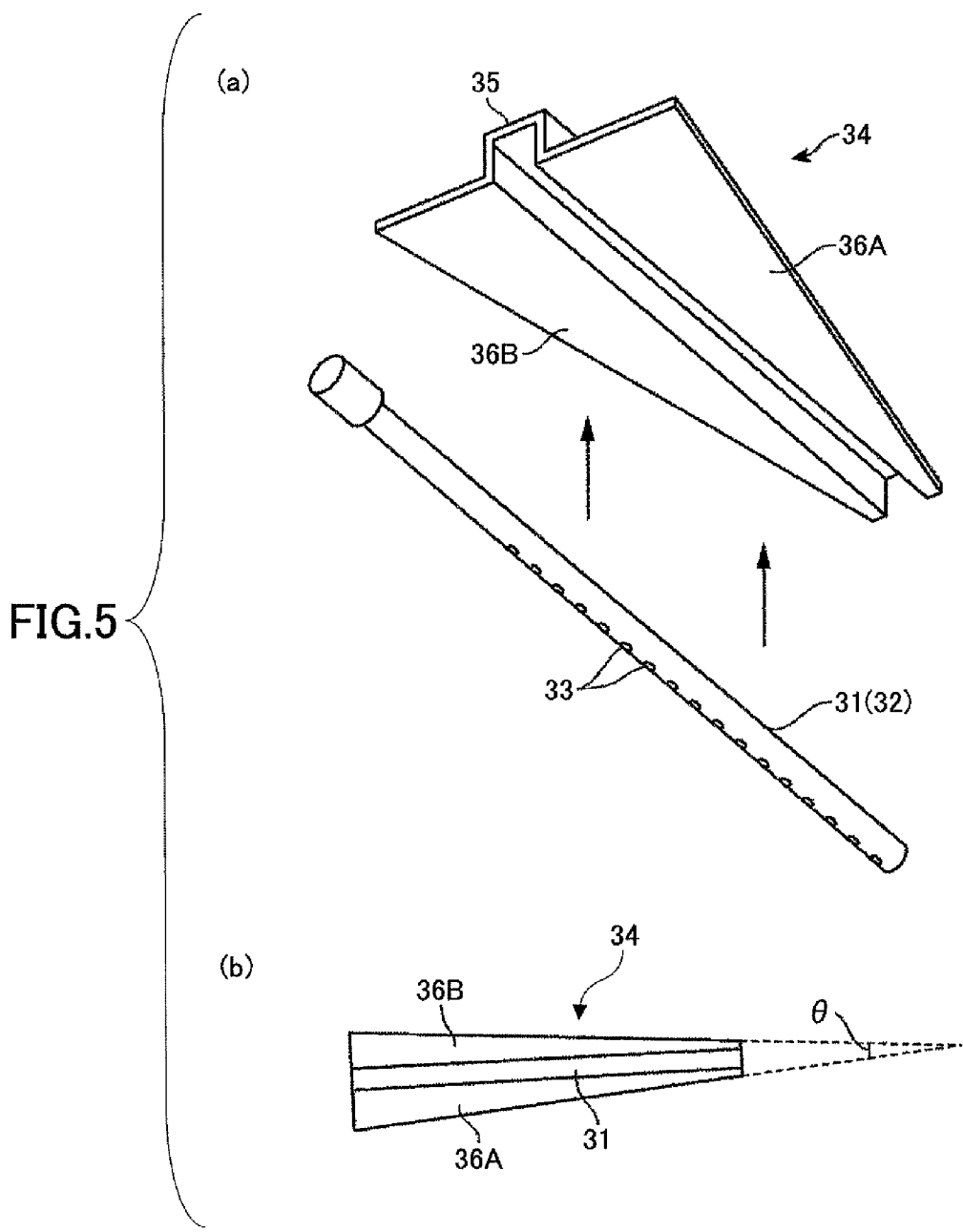
FIG. 5 is a schematic view of a reaction gas nozzle and a nozzle cover.

As shown in FIGS. 2 and 3, the reaction gas nozzles 31, 32 are provided with nozzle covers 34. Referring to FIG. 5, the nozzle cover 34 is explained below. The nozzle cover 34 extends in the longitudinal direction of the reaction gas nozzles 31 (or 32) and has a base portion 35 having a cross-sectional shape of "U". The base portion 35 is arranged in order to cover the reaction gas nozzle 31 (or 32). The base portion 35 has a flow regulation plate 36A attached in one of two edge portions extending in the longitudinal direction of the base portion 35 and a flow regulation plate 36B in the other of the two edge portions. In this embodiment, the flow regulation plates 36A, 36B are parallel with the upper surface of the turntable 2. In addition, the flow regulation plate 36A is arranged upstream relative to the rotation direction of the turntable 2 in relation to the reaction gas nozzle 31 (or 32), and the flow regulation plate 36B is arranged downstream relative to the rotation direction of the turntable 2 in relation to the reaction gas nozzle 31 (or 32), as shown in FIGS. 2 and 3.

As shown in Section (b) of FIG. 5, the flow regulation plates 36A, 36B are bilaterally symmetric with respect to the center axis of the reaction gas nozzle 31 (or 32). In addition, lengths of the flow regulation plates 36A, 36B in the rotation direction of the turntable 2 become longer in a direction from the center to the circumference of the turntable 2, so that the nozzle cover 34 has substantially a sector top view shape. A center angle of the sector shape that is shown by a dotted line in Section (b) of FIG. 5 may be determined taking into consideration a size of a convex portion 4 (separation area D), which are described later. For example, the center angle is preferably, for example, greater than or equal to 5° and less than 90°, or more preferably greater than or equal to 8° and less than 10°.

Incidentally, while the nozzle covers 34 are provided in both of the reaction gas nozzle 31 and the reaction gas nozzle 32 in this embodiment, the nozzle cover 34 may be provided in only one of the reaction gas nozzles 31, 32, depending on the reaction gas to be used.

The separation gas nozzles 41, 42 are connected to separation gas sources (not shown) of nitrogen ($N_2$) gas. The separation gas nozzles 41, 42 have plural ejection holes 40 (see FIG. 4) to eject the separation gases downward from the plural ejection holes 40. The plural ejection holes 40 are arranged at predetermined intervals in longitudinal directions of the separation gas nozzles 41, 42. The ejection holes 40 have an inner diameter of about 0.5 mm, and are arranged at intervals of about 10 mm in this embodiment. Incidentally, the separation gas is not limited to $N_2$ gas, but may be various gases as long as the separation gas does not adversely influence the film deposition.

The separation gas nozzles 41, 42 are provided in corresponding separation areas D that are configured to separate the first process area P1 and the second process area P2. In each of the separation areas D, there is provided a convex portion 4 on the ceiling plate 11, as shown in FIGS. 2 through 4. The convex portion 4 has a top view shape of a truncated sector and is protruded downward from the ceiling plate 11. The inner (or top) arc comes close to the protrusion portion 5 and an outer (or bottom) arc lies near and along the inner circumferential wall of the chamber body 12.

In addition, the convex portion 4 has a groove portion 43 that extends in the radial direction and substantially bisects the convex portion 4. The separation gas nozzle 41 (or 42) is located in the groove portion 43. A circumferential distance between the center axis of the separation gas nozzle 41 (or 42) and one side of the sector-shaped convex portion 4 is substantially equal to the other circumferential distance between the center axis of the separation gas nozzle 41 (or 42) and the other side of the sector-shaped convex portion 4. Incidentally, while the groove portion 43 is formed in order to bisect the convex portion 4 in this embodiment, the groove portion 42 is formed so that an upstream side of the convex portion 4 relative to the rotation direction of the turntable 2 is wider, in other embodiments.

With the above configuration, there are flat low ceiling surfaces 44 (first ceiling surfaces) on both sides of the separation gas nozzles 41, 42, and high ceiling surfaces 45 (second ceiling surfaces) outside of the corresponding low ceiling surfaces 44, as shown in Section (a) of FIG. 4. The convex portion 4 (ceiling surface 44) provides a separation space having a height h1 between the convex portion 4 and the turntable 2 in order to impede the first and the second gases from entering the thin space and from being intermixed. Specifically, the $O_3$ gas, which flows along the rotation direction of the turntable 2 from the reaction gas nozzle 32 toward the convex portion 4, is impeded from entering the space between the convex portion 4 and the turntable 2, and the BTBAS gas, which flows in a direction opposite to the rotation direction of the turntable 2 from the reaction gas nozzle 31 toward the other convex portion 4, is impeded from entering the space between the convex portion 4 and the turntable 2. Here, the height h1 (see Section (a) of FIG. 4) of the low ceiling surface 44, which is measured from the upper surface of the turntable 2, is determined so that the reaction gas is impeded from entering the separation (thin) space below the low ceiling surface 44. The height h1 may be, for example, 0.5 mm through 4 mm. In addition, a height h2 (see Section (a) of FIG. 4) of a lower end of the separation gas nozzle 41 (or 42), which is measured from the upper surface of the turntable 2, may be, for example, 0.5 mm through 4 mm.

"The gases being impeded from entering" means that the $N_2$ gas as the separation gas ejected from the separation gas nozzle 41 flows between the first ceiling surfaces 44 and the upper surface of the turntable 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the separation space, but that the gases cannot proceed farther toward the separation gas nozzle 41 and thus be mixed with each other even when a fraction of the reaction gases enter the separation space. Namely, as long as such effect is obtained, the separation area D is to separate atmospheres of the first process area P1 and the second process area P2. Incidentally, the BTBAS gas or the $O_3$ gas adsorbed on the wafer W can pass through and below the convex portion 4. Therefore, the gases in "the gases being impeded from entering" means the gases are in a gaseous phase.

Figure 8:
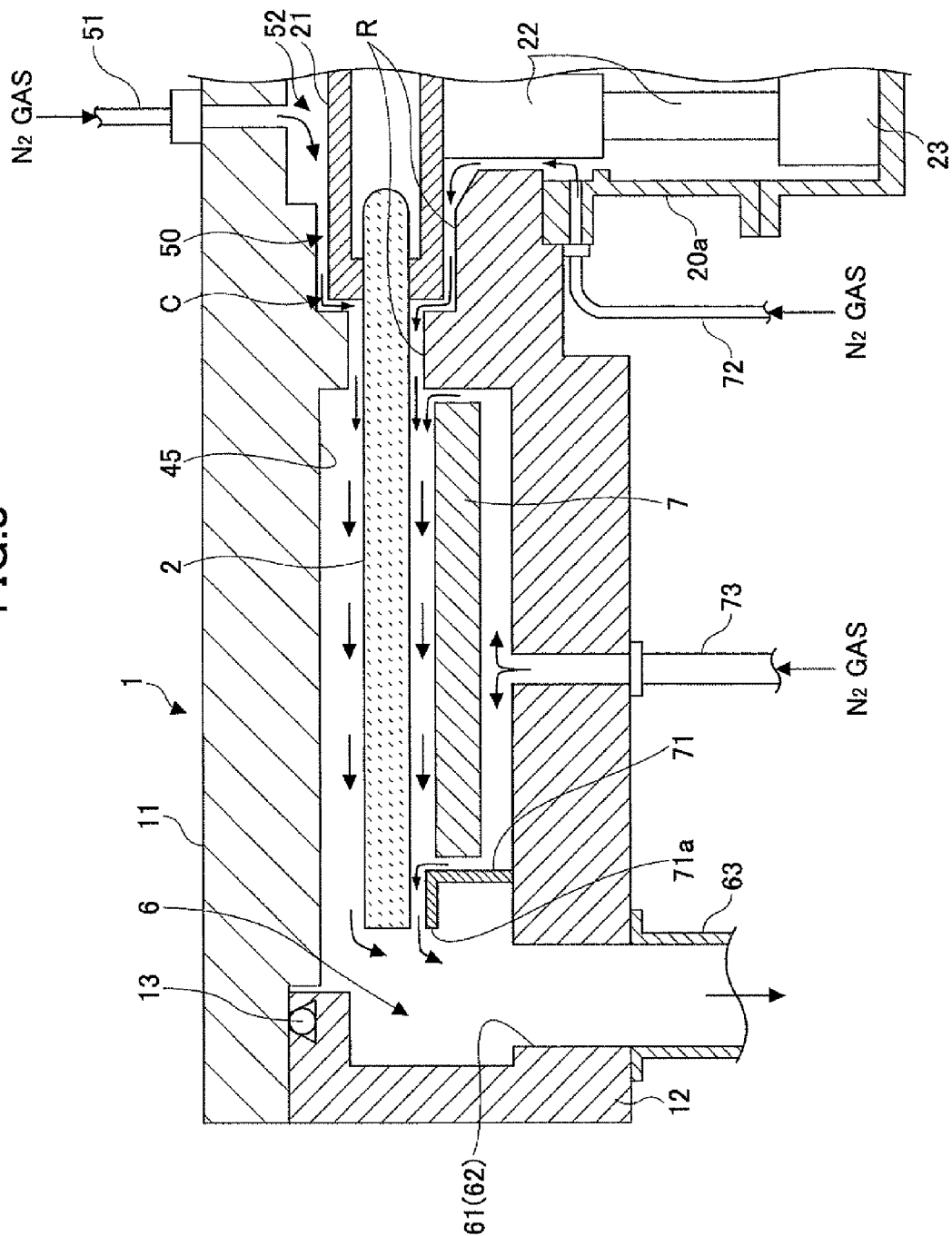
FIG. 8 is an explanatory view for illustrating a flow pattern of a separation gas or a purge gas flows in the film deposition apparatus of FIG. 1.

On the other hand, as shown in FIGS. 4 and 8, a ring-shaped protrusion portion 5 is provided on a back surface of the ceiling plate 11 so that the inner circumference of the protrusion portion 5 faces the outer circumference of the core portion 21 that fixes the turntable 2. The protrusion portion 5 opposes the turntable 2 at an outer area of the core portion 21. In addition, the protrusion portion 5 is integrally formed with the convex portion 4 so that a back surface of the protrusion portion 5 is at the same height as that of a lower surface of the convex portion 4 form the turntable 2. Namely, a height of lower surface of the protrusion portion 5 from the upper surface of the turntable 2 is equal to the height h1 of the lower surface (ceiling surface 44) of the convex portion 4. Incidentally, the convex portion 4 is formed not integrally with but separately from the protrusion portion 5 in other embodiments. Additionally, FIGS. 2 and 3 show the inner configuration of the vacuum chamber 1 as if the vacuum chamber 1 is severed along a horizontal plane lower than the ceiling surface 45 and higher than the reaction gases 31, 32.

In this embodiment, the wafer W to be placed on the concave portion 24 has a diameter of 300 mm. In this case, the convex portion 4 has a circumferential length of, for example, about 146 mm along an inner arc (a boundary between the convex portion 4 and the protrusion portion 5) that is at a distance 140 mm from the rotation center of the turntable 2, and a circumferential length of, for example, about 502 mm along an outer arc corresponding to the outermost portion of the concave portion 24 of the turntable 2. In addition, a circumferential length from one side wall of the convex portion 4 through the nearest side of the separation gas nozzle 41 (or 42) along the outer arc is about 246 mm.

Figure 6:
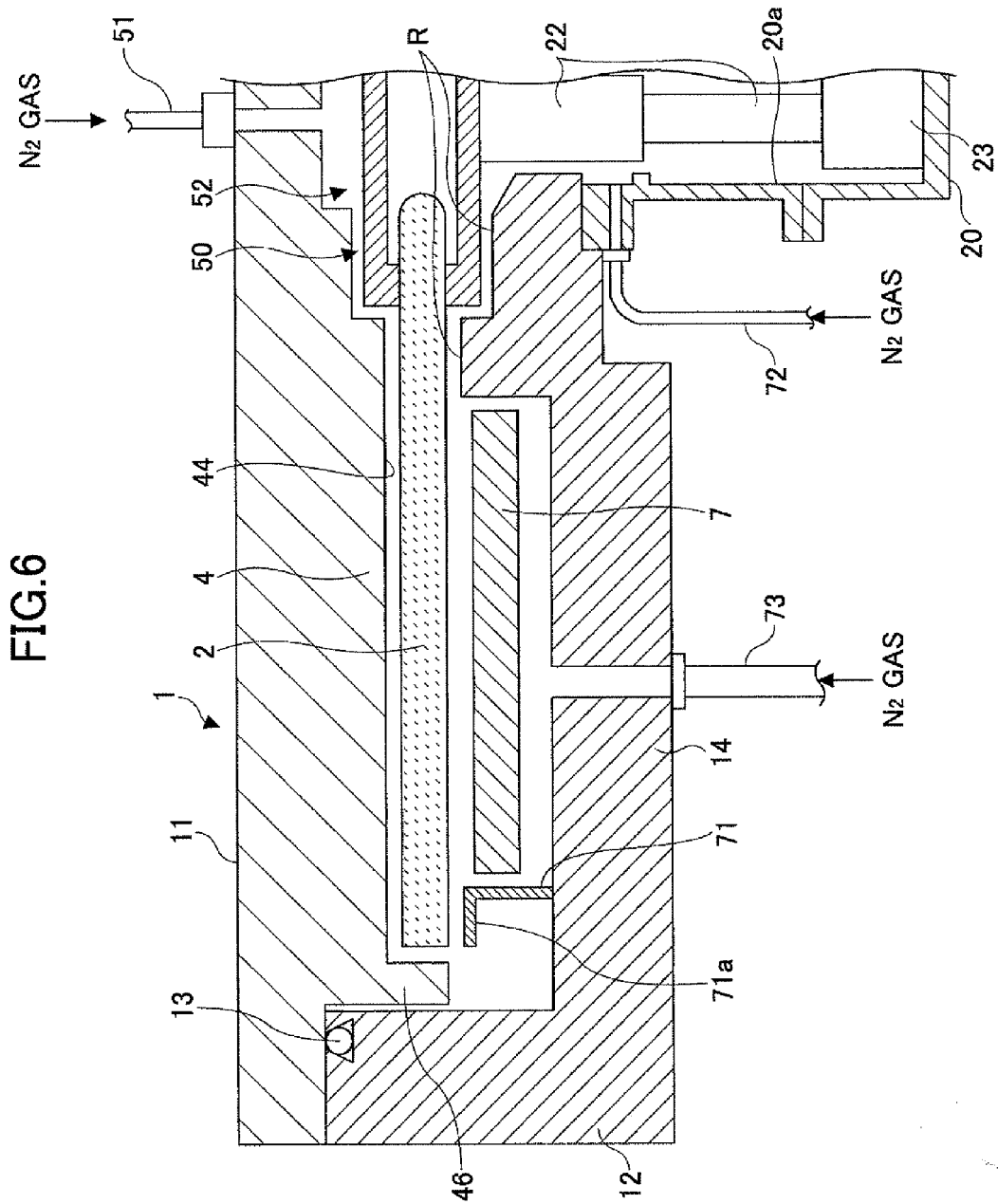
FIG. 6 is another cross-sectional view of the film deposition apparatus of FIG. 1.
Figure 7:
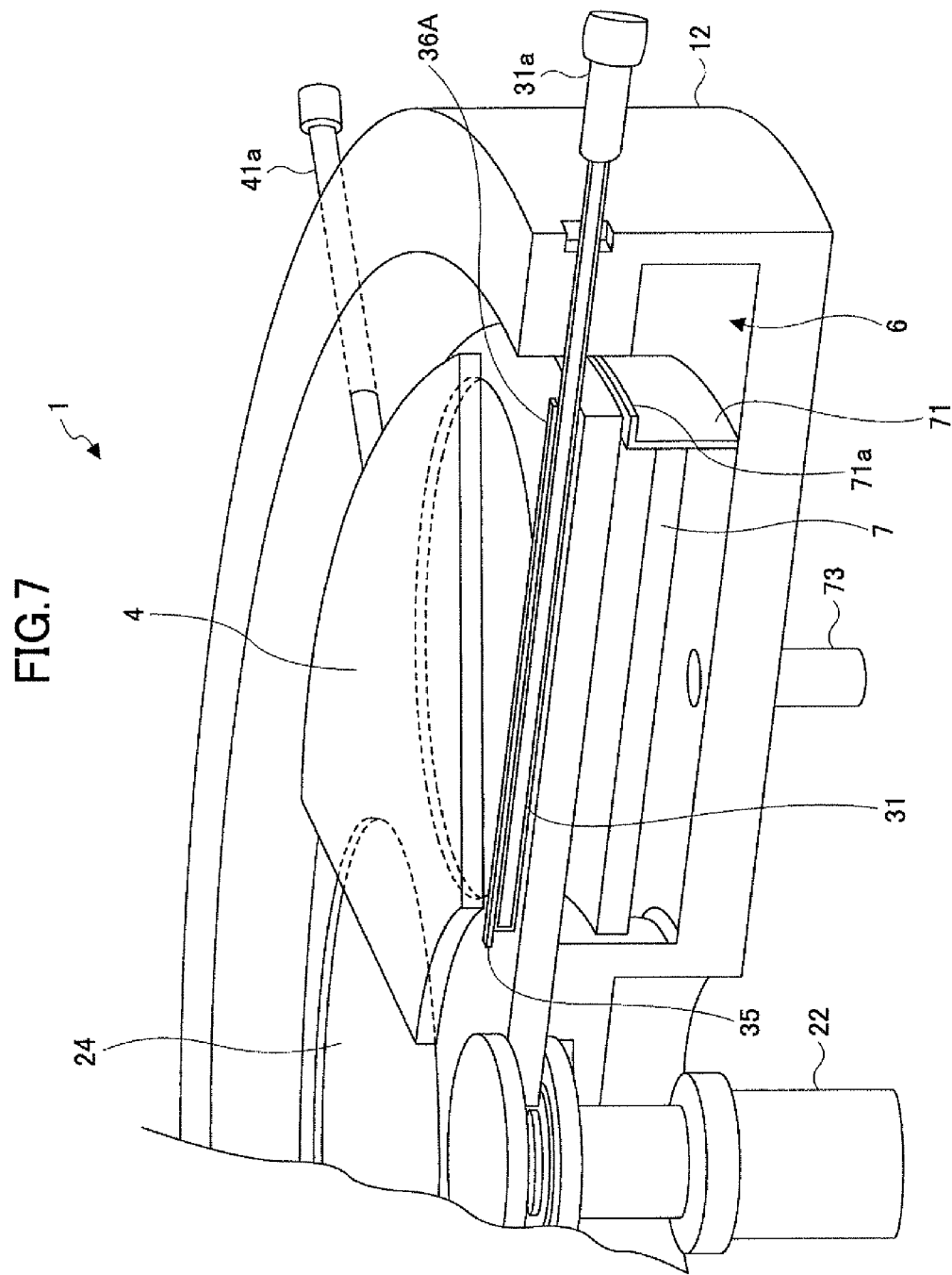
FIG. 7 is a cross sectional view of the reaction gas nozzle.

FIG. 6 illustrates a half of a cross-sectional view taken along II-II line in FIG. 3, where the convex portion 4 and the protrusion portion 5 formed integrally with the convex portion 4. As shown in FIG. 6, the convex portion 4 has at a circumferential portion (or at an outer side portion toward the inner circumferential surface of the chamber body 12) a bent portion 46 that bends in an L-shape. Although there are slight gaps between the bent portion 46 and the turntable 2 and between the bent portion 46 and the chamber body 12 because the convex portion 4 is attached on the back surface of the ceiling portion 11 and removed from the chamber body 12 along with the ceiling portion 11, the bent portion 46 substantially fills out a space between the turntable 2 and the chamber body 12, thereby reducing intermixing of the first reaction gas (BTBAS) ejected from the first reaction gas nozzle 31 and the second reaction gas (ozone) ejected from the second reaction gas nozzle 32 through the space between the turntable 2 and the chamber body 12. The gaps between the bent portion 46 and the turntable 2 and between the bent portion 46 and the chamber body 12 may be the same as the height h1 of the ceiling surface 44 from the turntable 2. In the illustrated example, an inner circumferential surface of the bent portion 46 may serve as an inner circumferential wall of the chamber body 12.

On the other hand, in areas where the convex portions 4 are not arranged (areas excluding the separation area D), the inner circumferential wall of the chamber body 12 is indented, so that evacuation areas 6 are formed, as shown in FIG. 3. An evacuation port 61 is formed in a bottom of the evacuation area E1, and an evacuation port 62 is formed at a bottom of the evacuation area E2, as shown in FIGS. 3 and 8. The evacuation ports 61, 62 are connected to a common vacuum pump 64 serving as an evacuation portion via corresponding evacuation pipes 63. In one of the evacuation pipes 63, a pressure adjusting portion 65 is provided, so that an inner pressure of the vacuum chamber 1 is adjusted. Alternatively, plural pressure adjusting portions 65 may be provided with respect to the corresponding evacuation ports 61, 62.

While the evacuation ports 61, 62 are formed in the bottom of the evacuation areas 6 in this embodiment, the evacuation ports 61, 62 may be provided in the circumferential wall of the chamber body 12. When the evacuation portions 61, 62 are provided in the circumferential wall, the evacuation ports 61, 62 may be located higher than the top surface of the turntable 2. In this case, gases flow along the top surface of the turntable 2 and into the evacuation ports 61, 62 located higher than the top surface of the turntable 2. Therefore, it is advantageous in that particles in the vacuum chamber 1 are not blown upward by the gases, compared to when the evacuation ports are provided, for example, in the ceiling plate 11. In addition, when the evacuation ports 61, 62 are provided in the bottom of the evacuation areas 6, the evacuation pipes 63, the pressure adjusting portion 65, and the vacuum pump 64 can be arranged below the vacuum chamber 1. Therefore, it is advantageous in that a footprint of the film deposition apparatus 1 can be reduced.

Referring to FIGS. 1 and 6 through 9, a ring-shaped heater unit 7 serving as a heating portion is provided in a space between the turntable 2 and the bottom portion 14 of the vacuum chamber 1, so that the wafer W on the turntable 2 can be heated up to a predetermined temperature via the turntable 2. Below the circumferential portion of the turntable 2, a cover member 71 is provided surrounding the heater unit 7, and thus an atmosphere of the space that houses the heater unit 7 is separated from an atmosphere outside of the heater unit housing space. The cover member 71 has at its upper end a flange portion 71a (FIG. 6) that is arranged so that a slight gap is maintained between the flange portion 71a and the lower surface of the turntable 2. Plural purge gas supplying pipes 73 are connected at predetermined angular intervals in order to go through the bottom portion 14 of the chamber body to reach the space that houses the heater unit 7. With this, the space is purged with a purge gas.

Referring again to FIG. 1, the bottom portion 14 has a raised portion R inside of the ring-shaped heater unit 7. An upper surface of the raised portion R comes close to the turntable 2 and the core portion 21, leaving slight gaps between the turntable 2 and the upper surface of the raised portion R and between the upper surface of the raised portion R and the bottom surface of the core portion 21. In addition, the bottom portion 14 has a center hole through which the rotational shaft 22 passes. An inner diameter of the center hole is slightly larger than a diameter of the rotational shaft 22, leaving a gap for gaseous communication with the case body 20 through the flanged pipe portion 20a. A purge gas supplying pipe 72 is connected to an upper portion of the flanged pipe portion 20a.

With such a configuration, $N_2$ purge gas flows from the purge gas supplying pipe 72 to a space between the turntable 2 and the heater unit 7 through a gap between the rotational shaft 22 and the center hole of the bottom portion 14, a gap between the core portion 21 and the raised portion R of the bottom portion 14, and a gap between the bottom surface of the turntable 2 and the raised portion R of the bottom portion 14. In addition, $N_2$ gas flows from the purge gas supplying pipes 73 to the space where the heater unit 7 is housed. Then, these $N_2$ gases flow into the evacuation port 61 through the gap between the flange portion 71a and the bottom surface of the turntable 2. These flows of $N_2$ gas are illustrated by arrows in FIG. 8. The $N_2$ gases serve as separation gases that substantially prevent the BTBAS ($O_3$) gas from flowing around the space below the turntable 2 to be intermixed with the $O_3$ (BTBAS) gas.

As shown in FIG. 8, a separation gas supplying pipe 51 is connected to a center portion of the ceiling plate 11 of the vacuum chamber 1. From the separation gas supplying pipe 51, $N_2$ gas as a separation gas is supplied to a space 52 between the ceiling plate 11 and the core portion 21. The separation gas supplied to the space 52 flows through a narrow gap 50 between the protrusion portion 5 and the turntable 2, and along the upper surface of the turntable 2 to reach the evacuation parts 6. Because the space 52 and the gap 50 are filled with the separation gas, the BTBAS gas and the $O_3$ gas are not intermixed through the center portion of the turntable 2. In other words, the film deposition apparatus according to this embodiment is provided with a center area C defined by a rotational center portion of the turntable 2 and the vacuum chamber 1, and configured to have an ejection opening for ejecting the separation gas toward the upper surface of the turntable 2 in order to separate atmospheres of the process area P1 and the process area P2. In the illustrated example, the ejection opening corresponds to the gap 50 between the protrusion portion 5 and the turntable 2.

Figure 9:
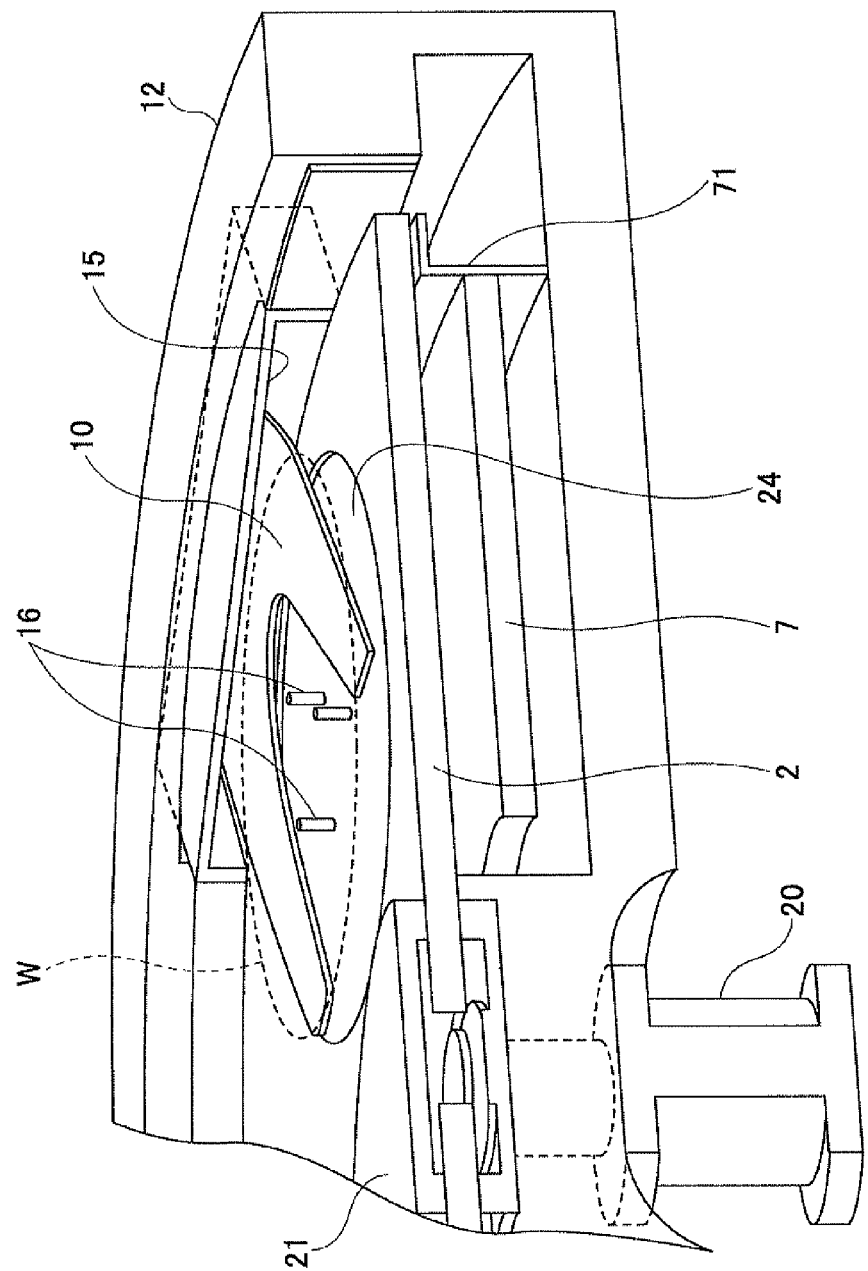
FIG. 9 is a broken perspective view illustrating the film deposition apparatus of FIG. 1.

Referring to FIGS. 2, 3, and 9, a transfer opening 15 is formed in a side wall of the chamber body 12. Through the transfer opening 15, the wafer W is transferred into or out from the chamber 1 by a transfer arm 10 (FIG. 9). The transfer opening 15 is provided with a gate valve (not shown) by which the transfer opening 15 is opened or closed.

In addition, the film deposition apparatus according to this embodiment is provided with a control portion 100 that controls the film deposition apparatus. The control portion 100 includes a process controller 100a composed of, for example, a computer, a user interface portion 100b, and a memory device 100c. The user interface portion 100b has a display that shows operation status of the film deposition apparatus, a keyboard or a touch panel (not shown) that is used by an operation in order to modify process recipes or by a process manager in order to modify process parameters, and the like.

The memory device 100c stores control programs that cause the process controller 100a to perform various film deposition processes, process recipes, parameters and the like to be used in the various processes. The programs include a group of instructions for causing the film deposition apparatus to perform operations described later. The control programs and process recipes are stored in a storage medium 100d such as a hard disk, a compact disk (CD), a magneto-optic disk, a memory card, a flexible disk, or the like, and installed into the control portion 100 from the storage medium 100d. In addition, the programs and recipes may be downloaded to the memory device 100c through a communication line.

Next, operations (a film deposition method) of the film deposition apparatus according to this embodiment are described. First, the concave portion 24 is aligned with the transfer opening 15 by rotating the turntable 2 (see FIG. 9), and the gate valve (not shown) is opened. Next, the wafer W is transferred into the vacuum chamber 1 by the transfer arm 10 through the transfer opening 15. Then, the lift pins 16 are brought upward to receive the wafer W from the transfer arm 10, and the transfer arm 10 retracts from the vacuum chamber 1. After the gate valve (not shown) is closed, the lift pins 16 are brought downward by a lift mechanism so that the wafer W is brought downward into the wafer receiving portion 24 of the turntable 2. Such operations are repeated by intermittently rotating the turntable 2, and five wafers W are placed in the corresponding concave portions 24 of the turntable 2.

Subsequently, the turntable 2 is rotated clockwise when seen from above at a predetermined rotation speed. The turntable 2 is heated to a predetermined temperature (for example, 300° C.) by the heater unit 7 in advance, and the wafers W can also be heated at substantially the same temperature by being placed on the turntable 2. After the wafers W are heated and maintained at the predetermined temperature, $N_2$ gas is supplied from the separation gas nozzles 41, 42. In addition, $N_2$ gas is supplied from the separation gas supplying pipe 51 and the purge gas supplying pipes 72, 73. Then, an inner pressure of the vacuum chamber 1 is set at a predetermined process pressure by the pressure adjusting portion 65 and the vacuum pump 64 (FIG. 1). Next, the BTBAS gas is supplied to the process area P1 from the reaction gas nozzle 31 and the $O_3$ gas is supplied to the process area P2 from the reaction gas nozzle 32.

When the wafer W passes through the process area P1 below the reaction gas nozzle 31 due to the rotation of the turntable 2, the BTBAS gas is adsorbed on the wafer W. Next, the $O_3$ gas is adsorbed on the wafer W when the wafer W passes through the process area P2 below the reaction gas nozzle 32, and thus the BTBAS gas on the wafer W is oxidized by the $O_3$ gas. Namely, when the wafer W passes through both the first process area P1 and the second process area P2 once, a monolayers) of silicon oxide is formed on the wafer W. Then, the wafer W alternatively passes through the process area P1 and the process area P2 plural times, and thus a silicon oxide film having a predetermined thickness is deposited on the wafer W. After the silicon film having the predetermined thickness is deposited, the supplying of the BTBAS gas and $O_3$ gas are stopped, and the rotation of the turntable 2 is stopped. Next, the wafers W are transferred out from the vacuum chamber 1 by the transfer arm 10 in an opposite manner when the wafers W were transferred into the vacuum chamber 1.

Next, a gas flow pattern in the vacuum chamber 1 is explained with reference to FIG. 10.

Figure 11:
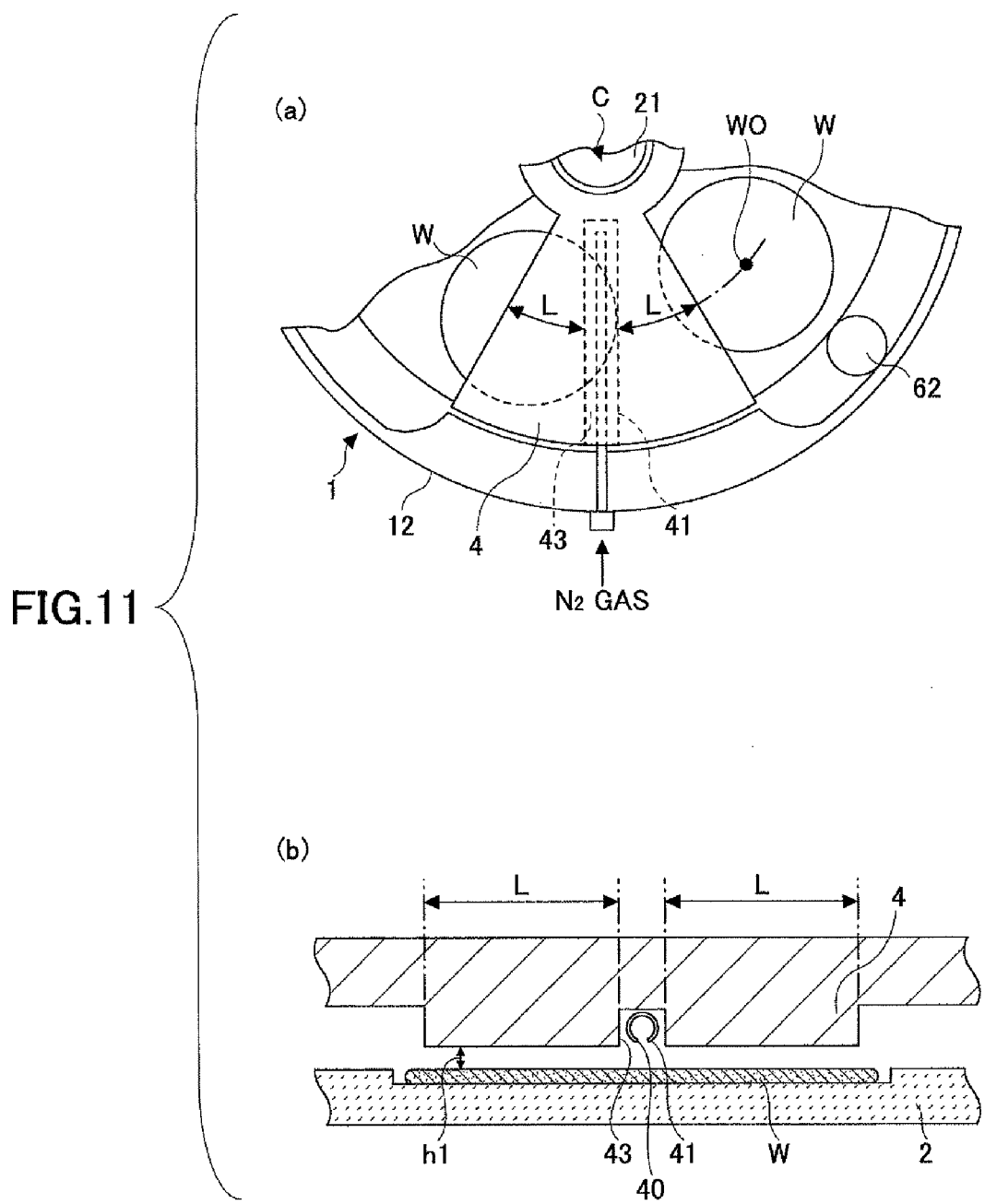
FIG. 11 is an explanatory view for explaining a size of a convex portion used in the separation area.

Part of the BTBAS gas ejected from the reaction gas nozzle 31 flows along the top surface of the turntable 2 in the rotation direction of the turntable 2. This part of the BTBAS gas cannot substantially flow into the separation space between the turntable 2 and the ceiling surface 44 (Section (b) of FIG. 4) of the convex portion 4 located downstream relative to the rotation direction of the turntable 2 in relation to the reaction gas supplying nozzle 31. This is in part because the height h1 of the ceiling surface 44 from the turntable 2 is small enough to impede the BTBAS gas from entering the separation space. In addition, because the convex portion 4 has a length L ranging from about one-tenth of a diameter of the wafer W through about a diameter of the wafer W, preferably, about one-sixth or more of the diameter of the wafer W along an arc that corresponds to a route through which a wafer center WO passes, as shown in Sections (a) and (b) of FIG. 11, there is a relatively large depth for the BTBAS gas to flow into the separation space between the ceiling surface 44 and the turntable 2. Such a narrow and deep space provides a relatively large resistance against the BTBAS gas, thereby making it difficult for the BTBAS gas to flow further into the separation space. Moreover, the separation gas ($N_2$ gas) supplied from the separation gas nozzle 42 arranged in the middle of the convex portion 4 impedes the BTBAS gas from flowing into the separation space.

Furthermore, because the evacuation port 61 is arranged between the reaction gas nozzle 31 and the separation area D located downstream relative to the rotation direction of the turntable 2 in relation to the reaction gas nozzle 31 in the bottom portion of the evacuation area 6, a majority part of the BTBAS gas flowing toward the separation area D is evacuated from the evacuation port 61, which reduces an amount of the BTBAS gas that flows into the separation space D between the ceiling surface 44 of the convex portion 4 and the turntable 2. Therefore, the evacuation port 61 so arranged contributes to separation of the BTBAS gas and the $O_3$ gas.

On the other hand, part of the $O_3$ gas ejected from the reaction gas nozzle 32 toward the turntable 2 may flow along the top surface of the turntable 2 in a direction opposite to the rotation direction of the turntable 2. However, the $O_3$ gas cannot substantially flow into the separation space between the turntable 2 and the convex portion 4 of the separation area D located upstream relative to the rotation direction in relation to the reaction gas nozzle 32. This is because the narrow and deep separation space is created by the convex portion 4, and because the separation gas is supplied from the separation gas nozzle 42 in the separation area D.

Namely, the BTBAS gas supplied from the reaction gas nozzle 31 and the $O_3$ gas supplied from the reaction gas nozzle 32 are substantially completely separated by the separation area. D arranged between the reaction gas nozzles 31, 32, and cannot be intermixed with each other.

The same explanation holds true for the other separation area D located upstream relative to the rotation direction in relation to the reaction gas nozzle 31.

As stated, in the film deposition apparatus according to this embodiment, because the height h1 (Section (a) of FIG. 4) of the lower surface (low ceiling surface 44) of the convex portion 4 from the turntable 2 is determined to be small enough to impede the reaction gas from flowing into the separation space between the convex portion 4 and the turntable 2 and the low ceiling surface 44 has a certain area, it is difficult for the reaction gas to flow into the separation space. Even if a fraction of the reaction gas flows into the separation space, the reaction gas cannot flow further into the separation space. Therefore, the reaction gases substantially cannot be intermixed in a gas phase.

In addition, even if a fraction of the reaction gas flows into the separation space between the convex portion 4 and the turntable 2, the reaction gas is pushed backward by the separation gas supplied from the separation gas nozzle 41 (or 42) arranged in the groove portion 43 of the convex portion 4, and thus the intermixture of the reaction gases in a gas phase can be greatly reduced.

Such a separation gas is advantageous in terms of reduced intermixture of the reaction gases in a gas phase. However, the separation gas flows from the separation space between the low ceiling surface 44 and the turntable 2 out to the spaces below the high ceiling surface 45, which includes the process areas P1, P2, and thus dilutes the reaction gases supplied toward the turntable 2 from the corresponding reaction gas nozzle 31, 32, depending on a flow rate of the separation gas. In this case, an adsorption rate of the reaction gases onto the wafer W may be reduced. According to the film deposition apparatus of this embodiment of the present invention, such a reduced adsorption rate may be avoided in the following manner.

Figure 12:
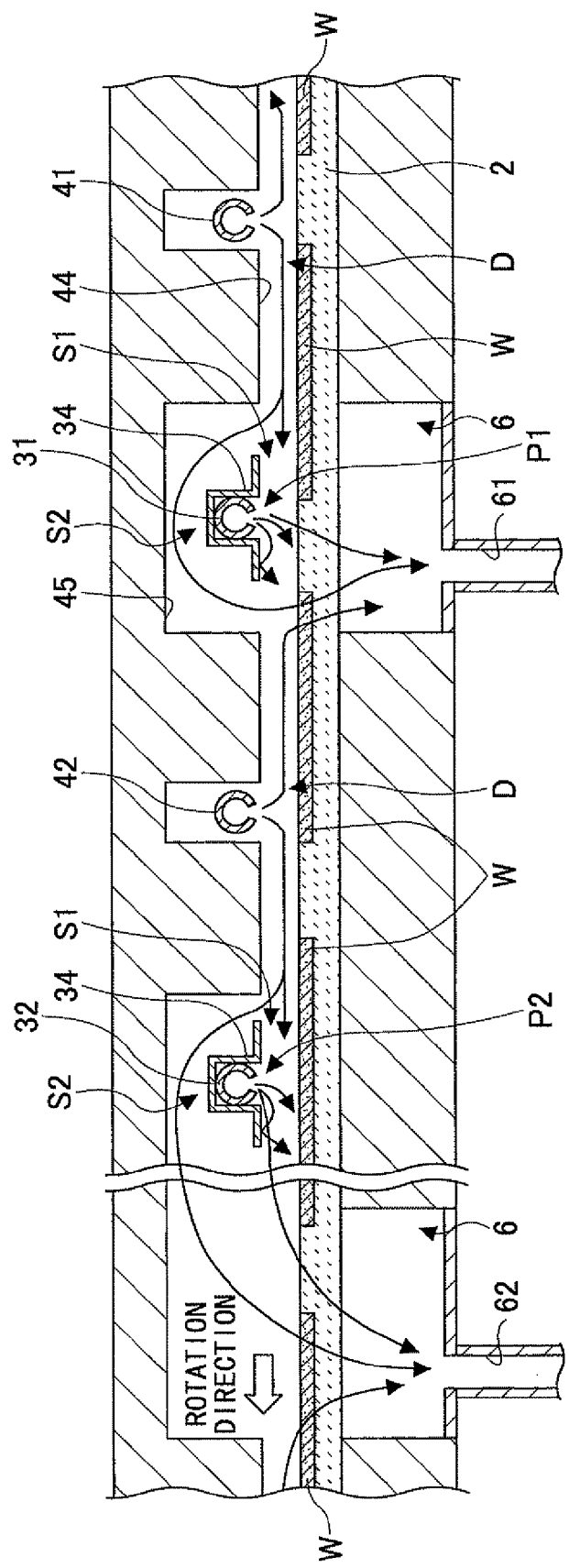
FIG. 12 is an explanatory view illustrating a gas flow pattern over a turntable of the film deposition apparatus of FIG. 1.
Figure 13:
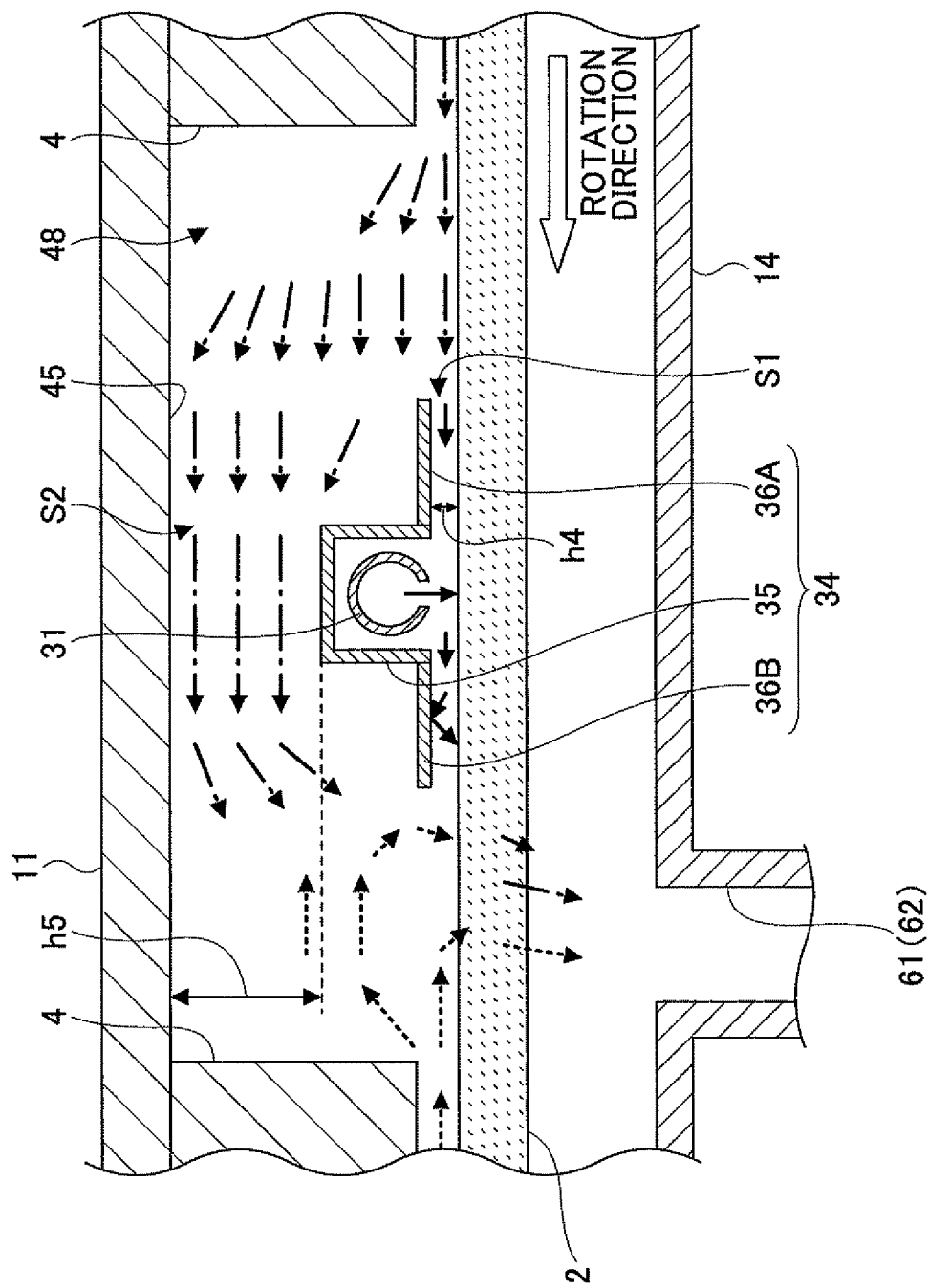
FIG. 13 is an explanatory view illustrating a specific flow pattern of the separation gas limited by the nozzle cover.
Figure 14:
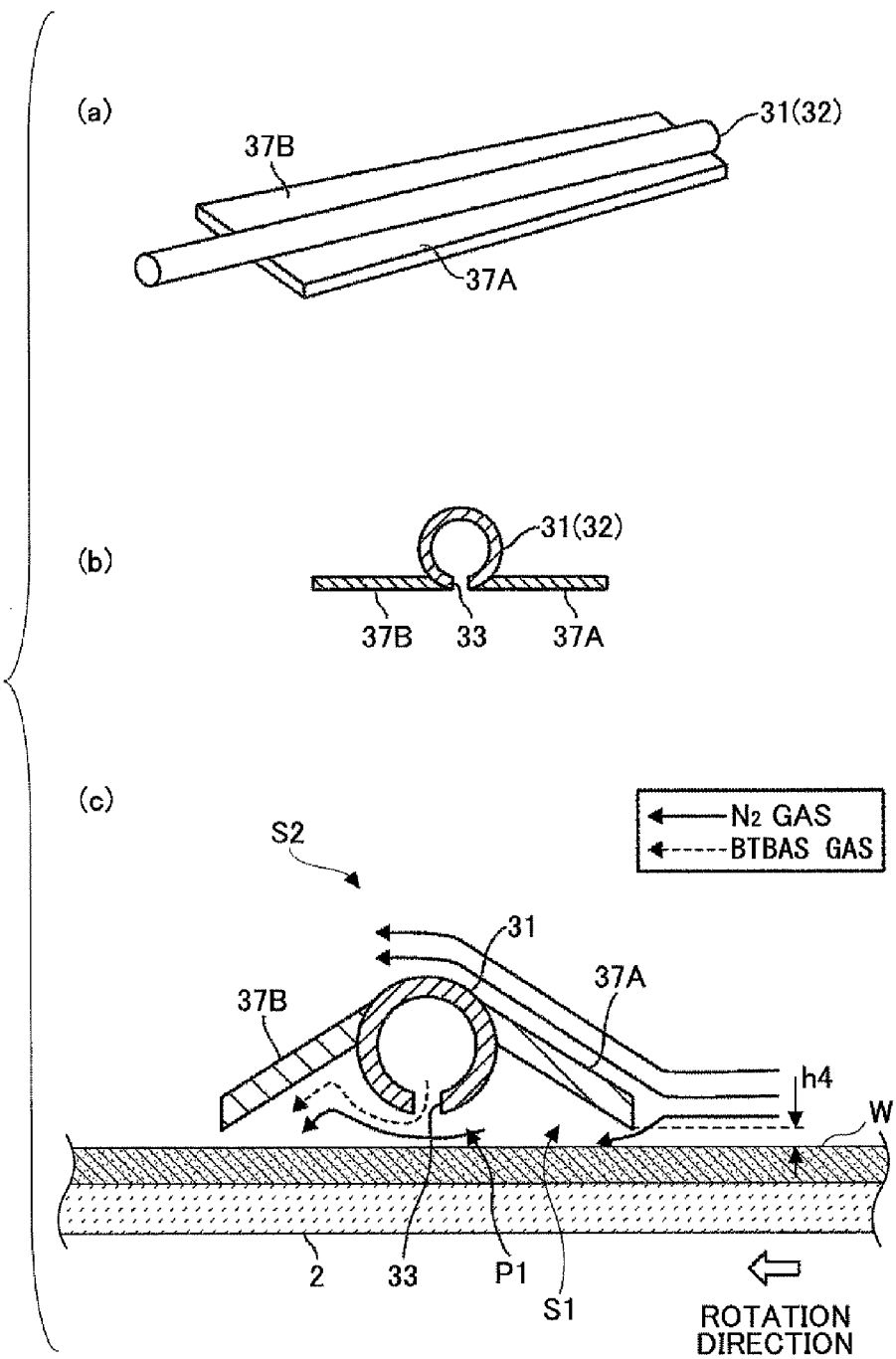
FIG. 14 is a perspective view and a cross-sectional view illustrating a modification of the nozzle cover.

FIG. 12 is an enlarged view of the inside of the vacuum chamber 1, seen through the circumferential wall of the chamber body 12, and FIG. 13 is an enlarged view of an area around the reaction gas nozzle 31 shown in FIG. 12. The separation gas supplied from the separation gas nozzle 41 in the separation area D flows out to a space 48 below the high ceiling surface 45, the space 48 including the process area P1 through the separation space between the convex portion 4 and the turntable 2, as shown in FIG. 12, and flows toward the reaction gas nozzle 31, as shown in FIG. 13. As shown, the reaction gas nozzle 31 is provided with the nozzle cover 34 including the flow regulation plates 36A, 3613. The flow regulation plates 36A, 36B are arranged close to and parallel with the turntable 2, and create a first space S1 below the flow regulation plates 36A, 36B and a second space S2 above the flow regulation plates 36A, 36B. A height h4 of the flow regulation plate 36A from the upper surface of the turntable 2 may be, for example, 0.5 mm through 4 mm, while a height of the high ceiling surface 45 from the turntable 2 is, for example, 15 mm through 50 mm. In addition, a distance h5 between the base portion 35 of the nozzle cover 34 and the high ceiling surface 45 may be, for example, 10 mm through 100 mm. In such a configuration the separation gas flowing toward the reaction gas nozzle 31 from the separation area D flows mainly through the second space S2 (the space above the flow regulation plates 36A, 36B) and is evacuated from the evacuation port 61. Therefore, the BTBAS gas supplied from the reaction gas nozzle 31 to the upper surface of the turntable 2 is not greatly diluted by the separation gas, and thus can reach the upper surface of the wafer W placed in the concave portion 24 at a relatively high concentration. Therefore, a relatively high adsorption rate of the BTBAS gas molecules can be obtained.

When the wafer W passes through the process area 21, if only half of the number of the BTBAS gas molecules that is enough to form one molecular layer of silicon oxide is adsorbed on the upper surface of the wafer W, two rotations of the turntable 2 are necessary to form one layer of the silicon oxide. However, because the adsorption rate of the reaction gas can be relatively high according to this embodiment of the present invention, one rotation of the turntable 2 may yield one monolayer of silicon oxide. In addition, even when the rotation speed of the turntable 2 is increased, it may be possible to make an amount of the reaction gas molecules be adsorbed in the wafer W, which contributes to increased process throughput. Moreover, because the reaction gas is not diluted, usage rate of the reaction gas can be improved, which leads to reduced production costs. From the foregoing, this embodiment of the present invention makes it possible to improve the adsorption rate and the usage rate of the reaction gases, thereby realizing increased process throughput and reduced production costs.

In addition, because the flow regulation plate 36A has a certain length along the rotation direction of the turntable 2, it is difficult for the separation gas to flow along the length direction in the first space S1 (the space below the flow regulation plate 36). Namely, the flow regulation plate 36A contributes to suppression of the separation gas flowing into the first space S1. Incidentally, because the separation gas flows at higher speed in an area near the circumference of the turntable 2 by centrifugal force due to the rotation of the turntable 2, a suppression effect of the separation gas flowing into the first space S1 may be reduced in the area near the circumference of the turntable 2. However, because a width of the flow regulation plate 36A becomes wider in a direction from the center to the circumference of the turntable 2, as shown in Section (a) of FIG. 5, the reduced suppression effect can be offset.

Incidentally, it is difficult to completely prevent the separation gas from flowing into the first space S1, and only a fraction of the separation gas, which is small enough not to dilute the reaction gas, can flow into the first space S1. However, such a fraction of the separation gas may be advantageous in that the fraction of the separation gas can purge by-products produced as a result of oxidization of the BTBAS gas by the $O_3$ gas.

In addition, the nozzle cover 34 may by provided only with the flow regulation plate 36A from a viewpoint of impeding the separation gas from flowing into the first space S1. However, the flow regulation plate 36B attached on a downstream side of the base portion 35 relative to the rotation direction of the turntable 2 is advantageous in that the BTBAS gas from the reaction gas nozzle 31 can remain for a relatively long time in the vicinity of the upper surface of the turntable 2. Namely, if there is not the flow regulation plate 36B, the BTBAS gas from the reaction gas nozzle 31 is guided by the separation gas flowing in the second space S2 and flows upward away from the upper surface of the wafer W. However, such a flow away from the wafer W can be reduced by the flow regulation plate 36B, which leads to an increased usage rate of the BTBAS gas. In addition, the flow regulation plate 36B is advantageous in order to impede the separation gas flowing from the separation area D located downstream relative to the rotation direction of the turntable 2 (the left separation area D in FIG. 13) from flowing into the first space S1.

While the reaction gas nozzle 31 and the nozzle cover 34 attached to the reaction gas nozzle 31 are explained, the nozzle cover 34 is provided with the reaction gas nozzle 32. Therefore, the $O_3$ gas is not diluted by the separation gas, and thus the adsorption rate and usage rate of the $O_3$ gas can be improved.

Figure 10:
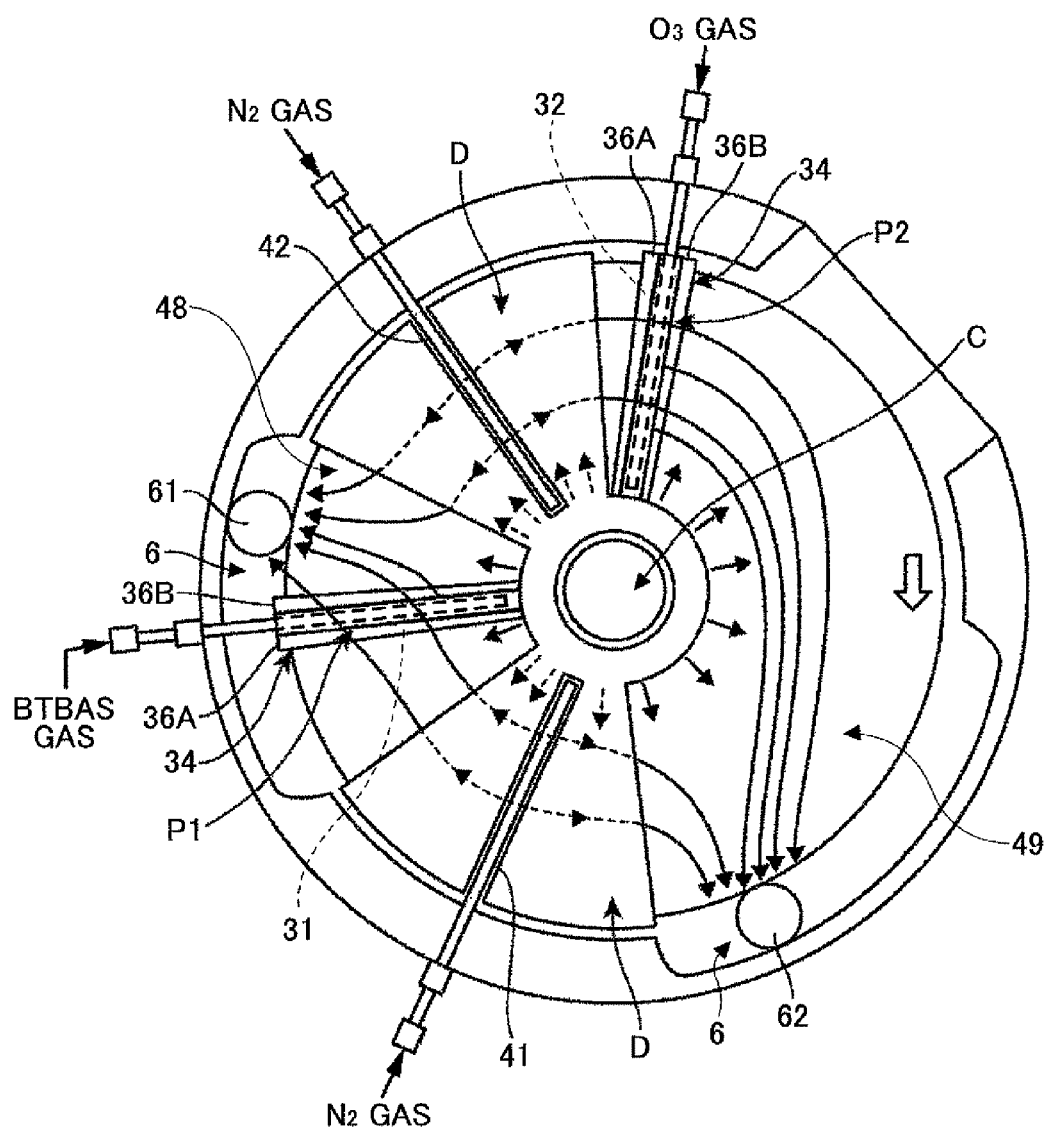
FIG. 10 is an explanatory view illustrating a gas flow pattern in the vacuum chamber of the film deposition apparatus of FIG. 1.

Incidentally, the reaction gas nozzle 32 is arranged close to the separation area D located upstream relative to the rotation direction of the turntable 2 in relation to the reaction gas nozzle 32, as shown in FIGS. 2, 3, and 10. Because it takes a relatively long time for the $O_3$ gas serving as an oxidizing gas to be adsorbed on the upper surface of the wafer W and to oxidize the BTBAS gas to produce silicon oxide, compared to a case where the BTBAS gas is adsorbed on the upper surface of the wafer W, the arrangement of the reaction gas nozzle 32 shown in the drawings is preferable in order to lengthen a time from the adsorption of the $O_3$ gas and the surface reaction of the $O_3$ gas with the BTBAS gas to the next adsorption of the BTBAS gas.

In the following, modifications of the nozzle cover 34 are explained with reference to FIGS. 14 through 18. As shown in Sections (a) and (b) of FIG. 14, flow regulation plates 37A, 37B may be attached to the reaction gas nozzles 31, 32 without using the base portion 35 (FIG. 5). In this case, the flow regulation plates 37A, 37B can be arranged away from the upper surface of the turntable 2 by the height h4 (FIG. 13), thereby providing the same effects as the nozzle cover 34. Even in this case, the flow regulation plates 37A, 37B may preferably have a top-view shape of a sector.

In addition, the flow regulation plates 36A, 36B, 37A, 37B are not necessarily parallel with the upper surface of the turntable 2. For example, the flow regulation plates 37A, 37B may be slanted from the upper portion of the reaction gas nozzle 31 toward the upper surface of the turntable 2, as shown in Section (c) of FIG. 14, as long as the height h4 of the flow regulation plates 37A, 37B from the upper surface of the turntable 2 is maintained so that the separation gas is likely to flow in the second space S2 (FIG. 12). The flow regulation plate 37A shown in the drawing is preferable in order to guide the separation gas toward the second space S2.

Figure 15:
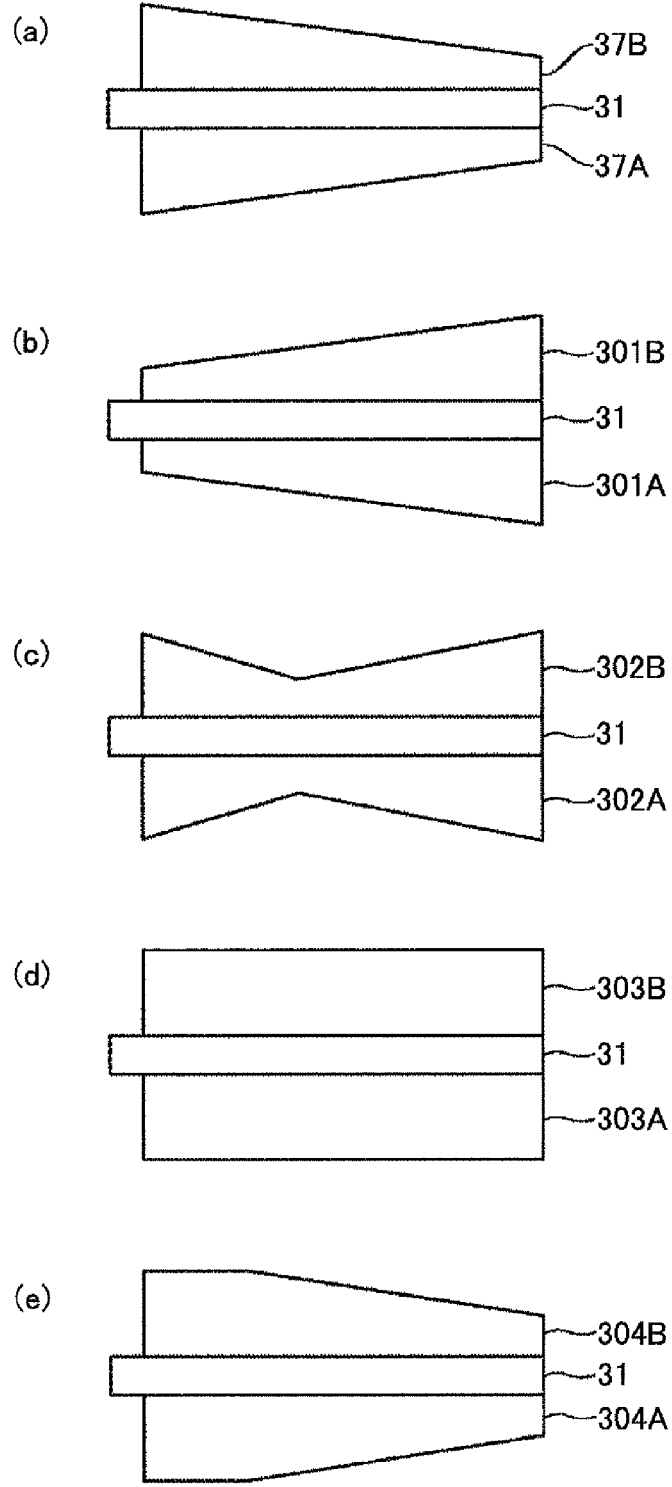
FIG. 15 is a plan view illustrating another nozzle cover.

In addition, while the flow regulation plates 37A, 37B as well as the flow regulation plates 36A, 36B preferably have a top-view shape of a sector, as shown in Section (a) of FIG. 15, the shape of the flow regulation plates 37A, 37B are not limited to the sector, depending on film deposition conditions. For example, the flow regulation plates 36A, 36B may have a sector shape that becomes wider along a direction toward the center of the turntable 2, as shown in Section (b) of FIG. 15. Alternatively, the flow regulation plates 36A, 36B may become narrower and then wider along the direction from the circumference of to the center of the turntable 2, as shown in Section (c) of FIG. 15. In addition, the flow regulation plates 36A, 36B may have a rectangular shape, as shown in Section (d) of FIG. 15, and may have a rectangular portion and a sector portion that becomes narrower along a direction toward the center of the turntable 2.

Figure 17:
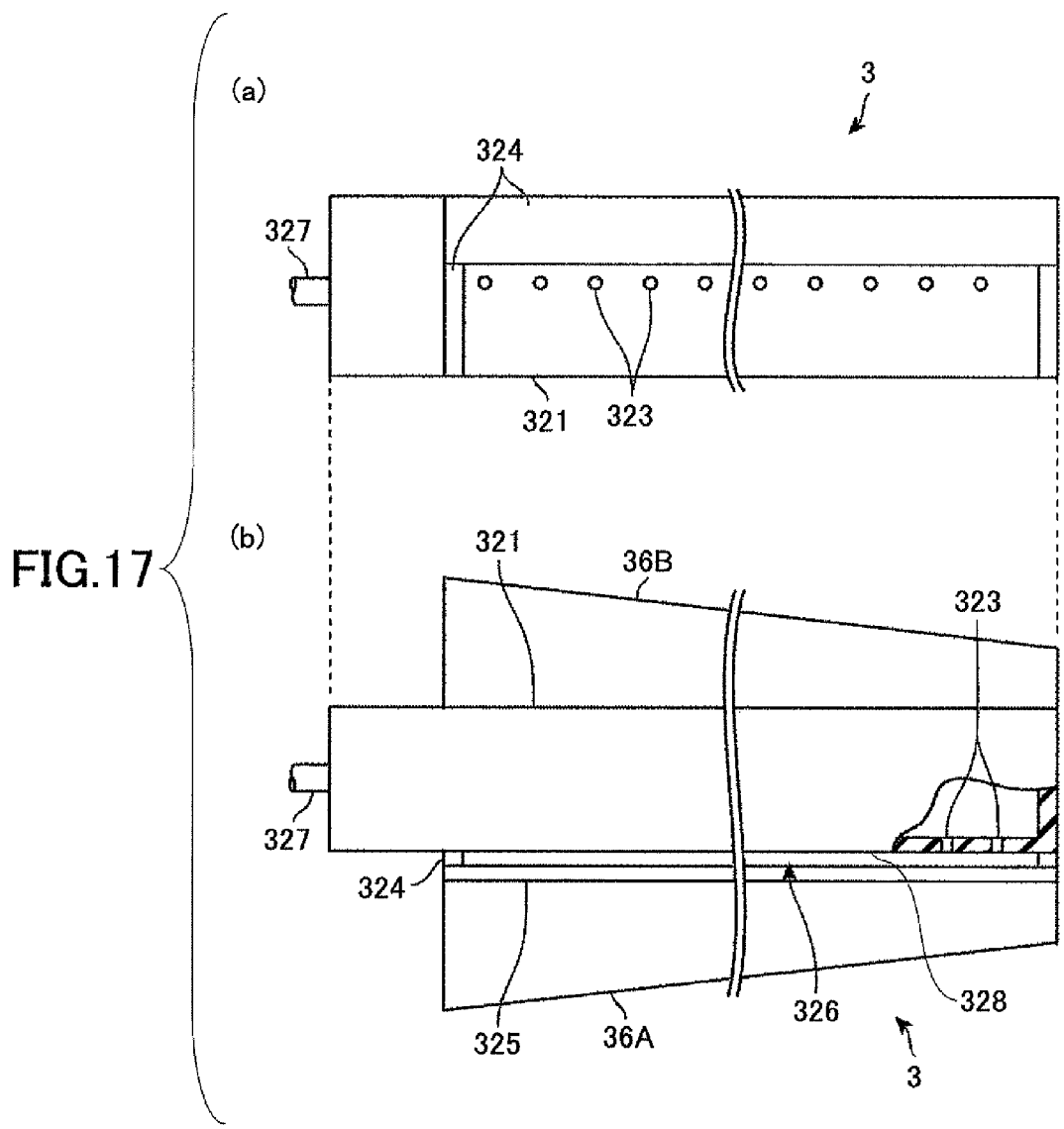
FIG. 17 is another explanatory view of the modification of the reaction gas nozzle of FIG. 16.
Figure 18:
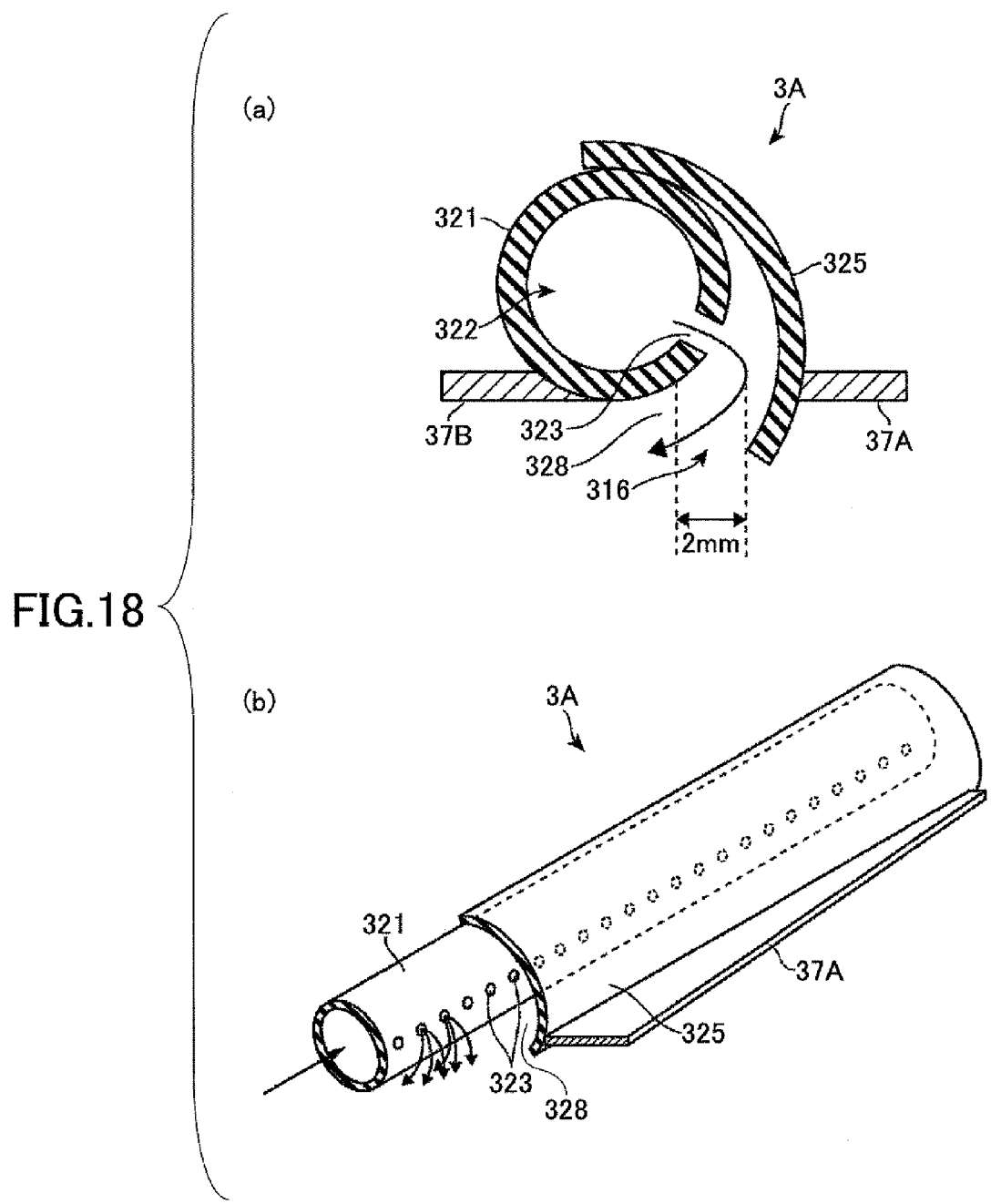
FIG. 18 is an explanatory view of another modification of a reaction gas nozzle.

Next, other modifications of the nozzle cover 34 are explained with reference to FIGS. 16 through 18. These modifications may be considered as a reaction gas nozzle integrated with a nozzle cover, or a reaction gas nozzle having a function of the nozzle cover.

Figure 16:
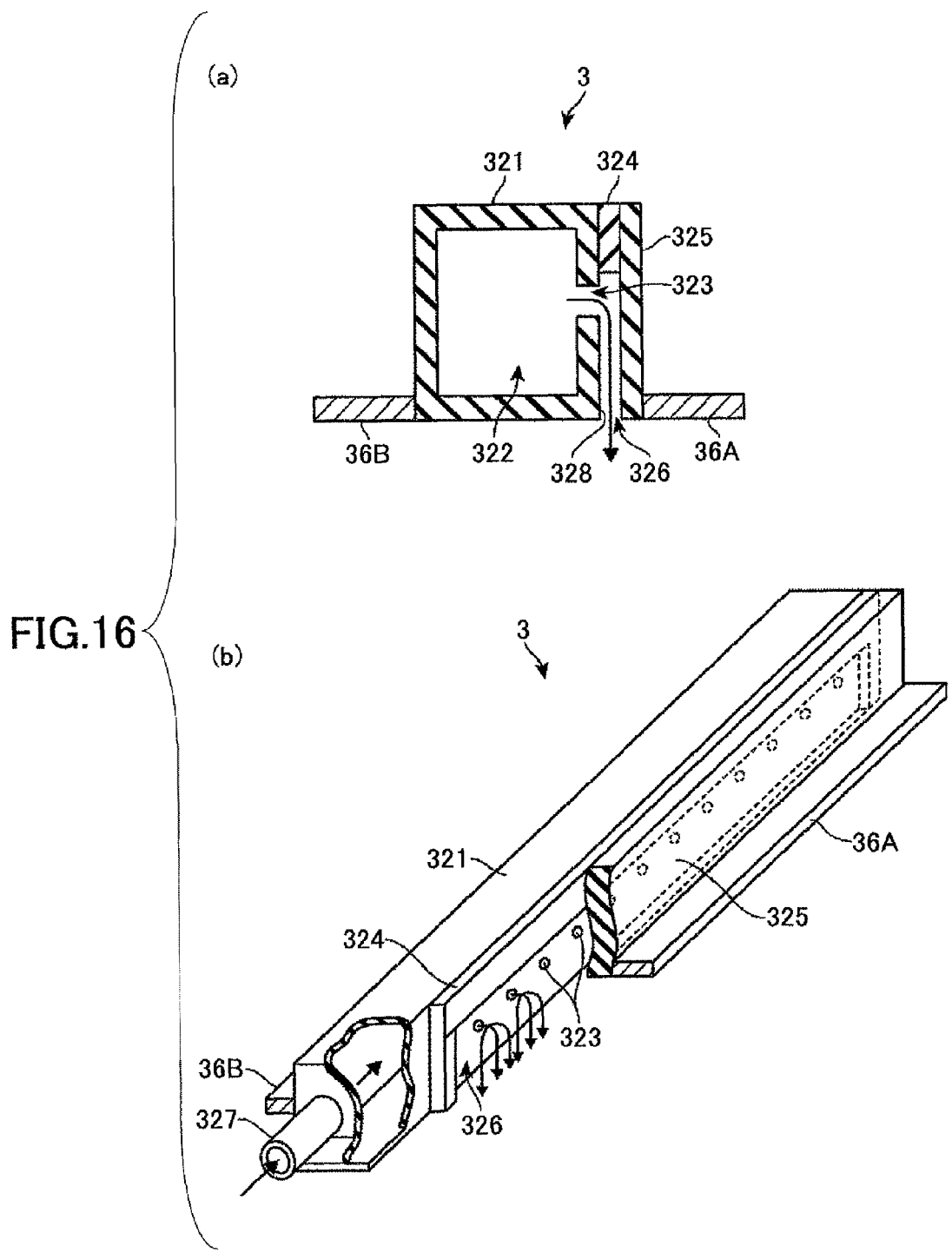
FIG. 16 is an explanatory view of a modification of a reaction gas nozzle.

Referring to Section (a) of FIG. 16, a reaction gas nozzle 321 is made of a rectangular pipe and has plural reaction gas ejection holes 323, each of which has an inner diameter of 0.5 mm on one side wall. As shown in Section (b) of FIG. 16, the reaction gas ejection holes 323 are arranged at intervals of 5 mm along a longitudinal direction of the reaction gas nozzle 321. In addition, a guide plate 325 is attached to the side wall where the reaction gas ejection holes 323 are formed, via a gap adjusting member 324. Referring to Section (b) of FIG. 16 and Section (a) of FIG. 17, the gas adjusting member 324, which has a reverse-U shape, is arranged in order not to interfere with the reaction gas flowing out from the reaction gas ejection holes 323. Therefore, as shown in Section (a) of FIG. 16, a slit-like reaction gas flow passage 326 is defined by the side wall where the reaction gas ejection holes 323 are formed, the gap adjusting member 324, and the guide plate 325. The reaction gas flow passage 326 has a gas ejection hole 328 open downward. Incidentally, a thickness of the gap adjusting member 324 is, for example, about 0.3 mm, and thus the reaction gas flow passage 326 also has a width of about 0.3 mm.

In addition, as shown in Section (b) of FIG. 16, the reaction gas nozzle 321 is connected to a gas introduction pipe 327 that goes through the circumferential wall (see FIG. 2) of the chamber body 12. With this, the reaction gas (e.g., BTBAS gas) is supplied to the reaction gas nozzle 321 through the gas introduction pipe 327, and then supplied toward the turntable 2 through the reaction gas passage 326 from the plural reaction gas ejection holes 323. Incidentally, when the reaction gas reaches the gas flow passage 326 through the reaction gas ejection holes 323 from the reaction gas nozzle 321, the reaction gas is blown against the guide plate 325 and thus spreads along the longitudinal direction of the reaction gas nozzle 321, as shown by plural arrows in Section (b) of FIG. 16. Therefore, the reaction gas concentration becomes uniform in the gas flow passage 326. Namely, this modification is preferable in that a thickness of a film deposited on the wafer W can be uniform.

The flow regulation plate 36A is attached to a lower end of the guide plate 325, and the flow regulation plate 36B is attached to a lower end of the side wall of the reaction gas nozzle 321, where no reaction gas ejection holes 323 are formed. As shown in Section (b) of FIG. 17, the flow regulation plates 36A, 36B are formed so that the modified nozzle cover (reaction gas nozzle) has a sector-like top-view shape. In addition, because the reaction gas nozzle 321 can be supported by the gas introduction pipe 327 so that the $N_2$ gas is likely to flow through the second space S2 above the reaction gas nozzle 321 rather than the first space S1 below the flow regulation plates 36A, 36B and the reaction gas nozzle 321, the same effect as the nozzle cover 34 can be provided.

Incidentally, the reaction gas nozzle 321 having the above configuration may be used to supply the second reaction gas (e.g., $O_3$ gas) toward the turntable 2.

Next, another modification is explained with reference to FIG. 18. As shown, a reaction gas nozzle 321 of this modification is made of a circular cylindrical pipe in the same manner as the reaction gas nozzles 31, 32. In addition, the reaction gas nozzle 321 is provided in order to go through the circumferential wall of the chamber body 12 of the vacuum chamber 1 (FIG. 1), in the same manner as the reaction gas nozzles 31, 32. Moreover, the reaction gas nozzle 321 has plural ejection holes 323 each of which has an inner diameter of about 0.5 mm, and the ejection holes 323 are arranged at intervals of about 10 mm along the longitudinal direction of the reaction gas nozzle 321, in the same manner as the reaction gas nozzles 31, 32. However, the reaction gas nozzle 321 is different from the reaction gas nozzles 31, 32 in that the plural ejection holes 323 are open at a predetermined angle with respect to the upper surface of the turntable 2. In addition, the guide plate 325 is attached to an upper portion of the reaction gas nozzle 321. The guide plate 325 has a larger radius of curvature than that of the circular cylindrical pipe of the reaction gas nozzle 321. Because of the difference in the radii of curvature, a gas flow passage 316 is created between the reaction gas nozzle 321 and the guide plate 325. The reaction gas supplied from a gas supplying source (not shown) to the reaction gas nozzle 321 is ejected from the ejection holes 323 and hits the guide plate 325. As a result, the reaction gas, whose concentration becomes uniform along the longitudinal direction of the reaction gas nozzle 321, reaches the upper surface of the wafer W (FIG. 13) placed on the turntable 2.

Moreover, the flow regulation plate 37A that extends in an upstream direction relative to the rotation direction of the turntable 2 is provided to a lower portion of the guide plate 325, and the flow regulation plate 37B that extends in a downstream direction relative to the rotation direction of the turntable 2 is provided to a lower end portion of the reaction gas nozzle 321.

The reaction gas nozzle 321 so configured is arranged so that the flow regulation plates 37A, 37B are close to the upper surface of the turntable 2 in order to define the first space S1 where the separation gas is unlikely to flow therethrough and the second space S2 through which the separation gas is likely to flow therethrough compared to the first space S1. Therefore, the same effect as explained above is provided.

Figure 19:
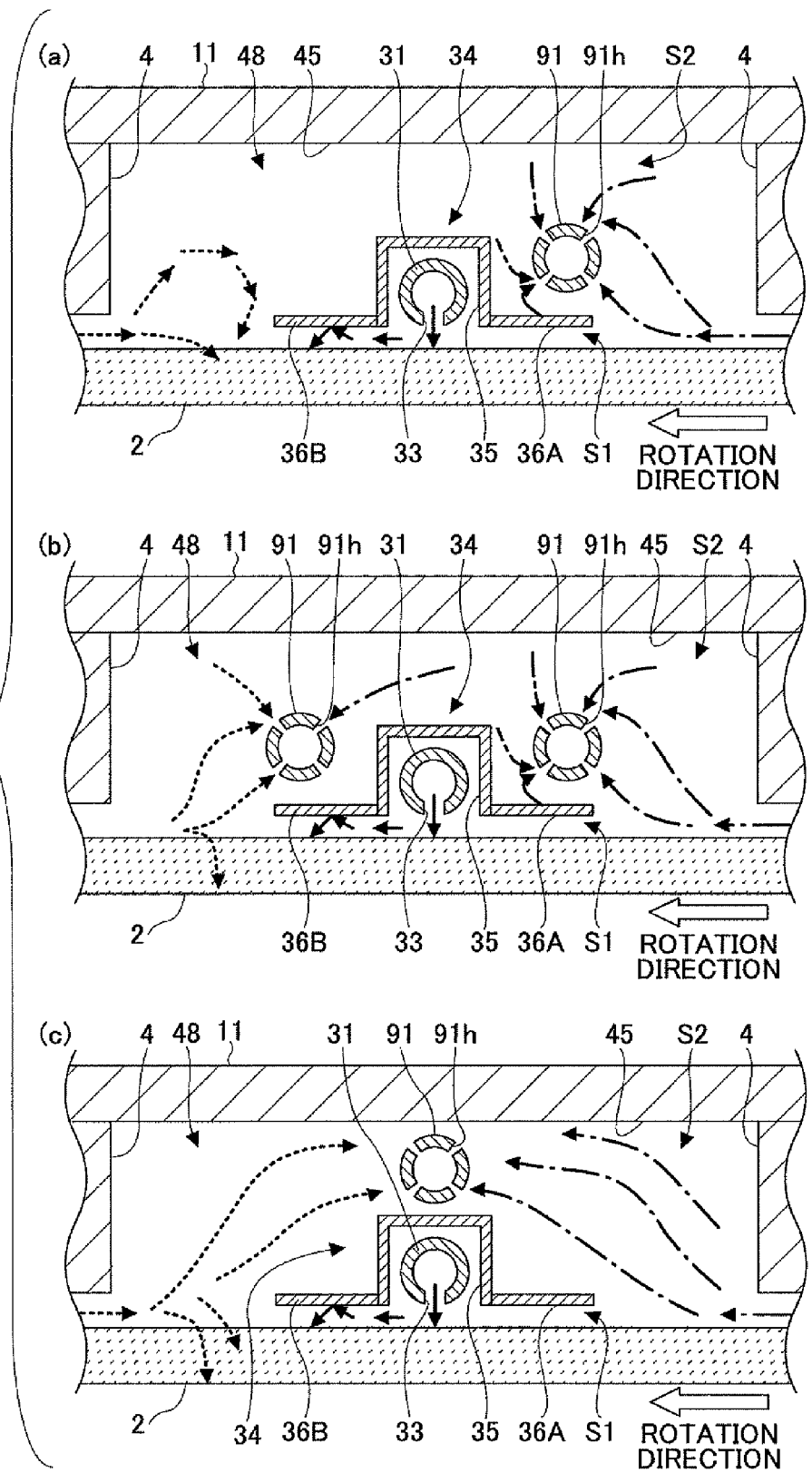
FIG. 19 is an explanatory view of an evacuation nozzle to be used in a film deposition apparatus according to an embodiment of the present invention.
Figure 20:
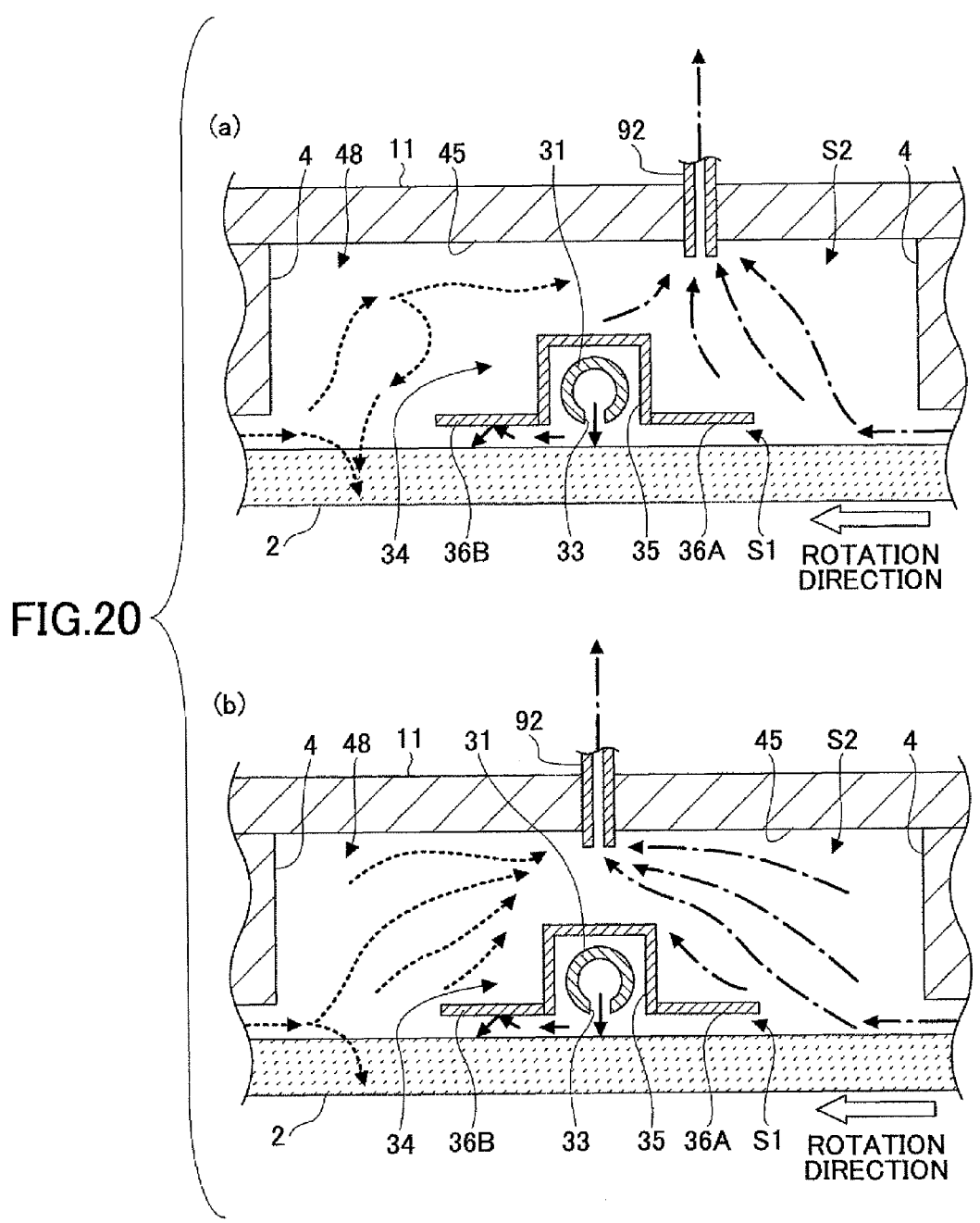
FIG. 20 is another example of the evacuation nozzle to be used in a film deposition apparatus according to an embodiment of the present invention.
Figure 21:
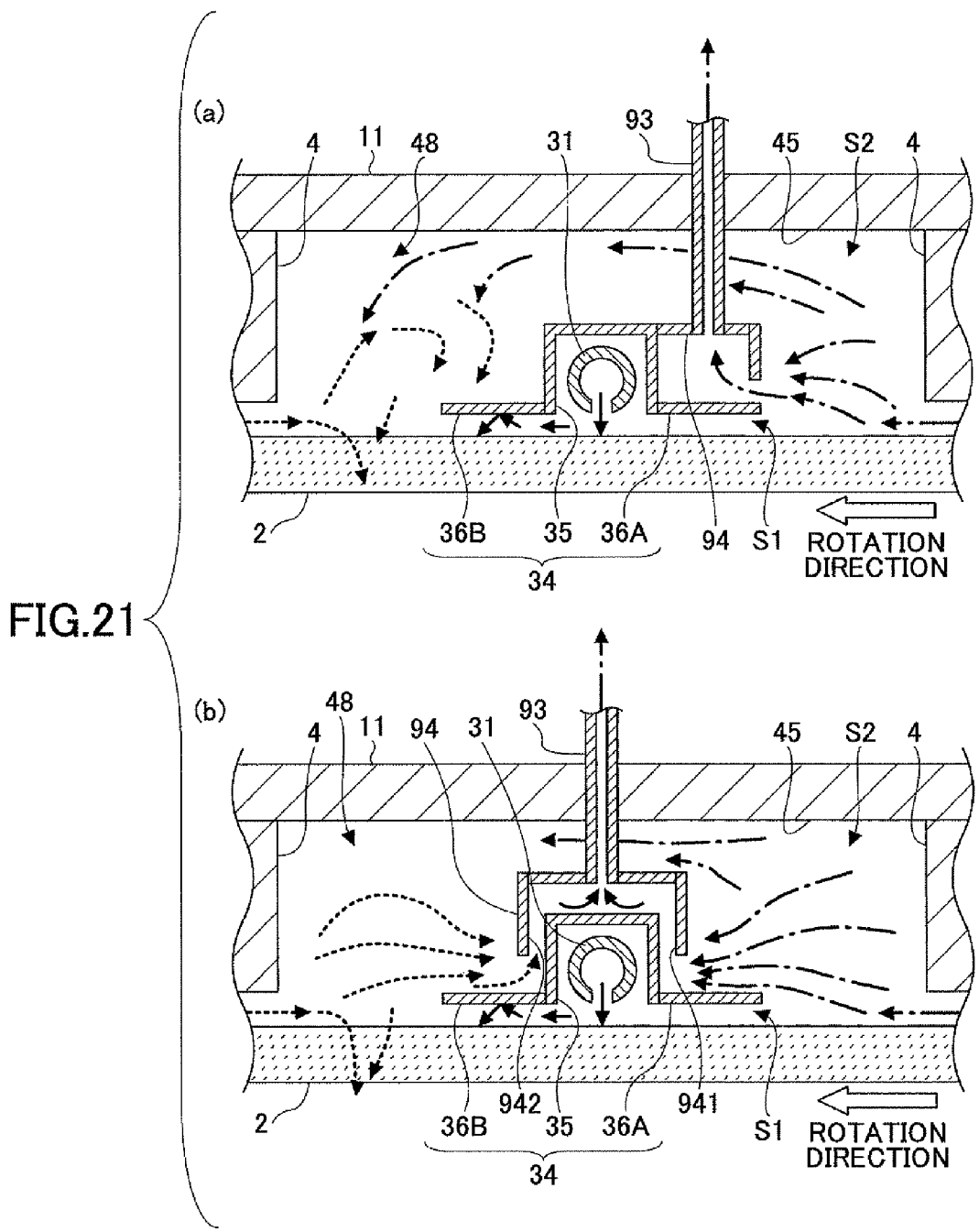
FIG. 21 is an explanatory view of another evacuation nozzle to be used in a film deposition apparatus according to an embodiment of the present invention.

Next, evacuation nozzles that facilitate a flow of the separation gas toward the second space S2 are explained with reference to FIGS. 19 through 21. FIGS. 19 through 21 illustrate the two convex portions 4 and the reaction gas nozzle 31 between the two convex portions 4, which are observed through the circumferential wall of the chamber body 12 of the vacuum chamber 1. The evacuation port 61 is omitted in these drawings.

Referring to Section (a) of FIG. 19, the reaction gas nozzle 31 that is provided in the space 48 substantially defined by the ceiling plate 11 of the vacuum chamber 1 (FIG. 1), the turntable 2, and the two convex portions 4, and the nozzle cover 34 attached to the reaction gas nozzle 31 are illustrated. An evacuation nozzle 91 is arranged above the flow regulation plate 36A of the nozzle cover 34. The evacuation nozzle 91 goes through the circumferential wall of the chamber body 12 of the vacuum chamber 1 to be introduced into the inside of the vacuum chamber 1 and extends along the radius direction of the turntable 2, in the same manner as the reaction gas nozzle 31. In addition, the evacuation nozzle 91 has plural evacuation holes 91h. In the illustrated example, the plural evacuation holes 91h are arranged at intervals of about 90° along the circumferential wall and at predetermined intervals along a longitudinal direction of the evacuation nozzle 91. An inner diameter of the evacuation holes 91h and the intervals along the longitudinal direction may be determined in accordance with preliminary experiments and/or results of computer simulation. Incidentally, a distal end portion (a portion near the core portion 21 in the vacuum chamber 1) is closed, and a base end portion outside the vacuum chamber 1 is connected to an evacuation pipe 63 provided to evacuate the vacuum chamber 1. With this, mainly the separation gas in the space 48 is evacuated through the evacuation holes 91*h*.

With the above configurations, an area around the evacuation nozzle 91 is maintained at a lower temperature than other areas of the space 48. Therefore, the separation gas is likely to flow toward the second space S2 above the nozzle cover 34 rather than the first space S1 below the nozzle cover 34. Therefore, the separation gas is guided to the second space S2 and the reaction gas (e.g., the BTBAS gas) is not likely to be diluted by the separation gas. In other words, the evacuation nozzle 91 can enhance the effect caused by the nozzle cover 34.

In addition, as shown in Section (b) of FIG. 19, an additional evacuation nozzle 91 may be provided above the flow regulation plate 36B. With this, the separation gas flowing toward the space 48 located downstream relative to the rotation direction of the turntable 2 in relation to the reaction gas nozzle 31 is guided to the second space S2 above the nozzle cover 34, thereby sufficiently suppressing dilution of the reaction gas.

Moreover, as shown in Section (c) of FIG. 19, the evacuation nozzle (s) 91 may be arranged above the base portion 35 of the nozzle cover 34. With this, a pressure of the second space S2 becomes reduced, thereby facilitating the separation gas to be guided toward the second space S2.

Next, referring to FIG. 20, an evacuation nozzle 92 is illustrated that goes through the ceiling plate 11 of the vacuum chamber 1 (FIG. 1) in an air-tight manner, and has an opening opened above the flow regulation plate 36A. The evacuation nozzle 92 is connected to an evacuation pipe 63 that evacuates the second space S2 above the nozzle cover 34. With this, a pressure of the second space S2 becomes reduced, thereby facilitating the separation gas to be guided toward the second space S2. As a result, dilution of the reaction gas in the first space S1 below the nozzle cover 34 is suppressed.

In addition, the evacuation nozzle 92 may be arranged above and open toward the base portion 35 of the nozzle cover 34. With this, the separation gas is likely to flow toward the second space S2 above the nozzle cover 34. Incidentally, plural of the evacuation nozzles 92 may be arranged along the radius direction of the ceiling plate 11 at predetermined angular intervals. In addition, the evacuation nozzle(s) 92 is not necessarily arranged vertically with respect to the ceiling plate 11, but may be slanted toward the upstream side of the rotation direction of the turntable 2. Moreover, the evacuation nozzle(s) 92 may be introduced into the vacuum chamber 1 in order to be vertical relative to the ceiling plate 11 and then bent toward the upstream side of the rotation direction of the turntable 2. A bent angle may be, for example, more than 0° and less than 90°.

Incidentally, when the evacuation nozzle (s) 91 and/or 92 is used, the nozzle cover 34 is not always necessary. This is because a pressure in the space above the reaction gas nozzle 31 or 32 can be lower than that of the space below the reaction gas nozzle 31 or 32. However, the evacuation gas nozzle(s) 91 and/or 92 and the nozzle cover 34 are preferably used at the same time, because the evacuation nozzle(s) 91 or 92 tends to attract the reaction gas when the nozzle cover 34 is absent.

Next, referring to Section (a) of FIG. 21, this drawing illustrates a partition wall 94 that defines a space above the flow regulation plate 36A of the nozzle cover 34, and an evacuation nozzle 93 that goes through the ceiling plate 11 of the vacuum chamber 1 (FIG. 1) from the inside to the outside of the vacuum chamber 1 in an air-tight manner. The partition wall 94 is attached to be continuous to the upper portion of the base portion 35 of the nozzle cover 34 and bent downward in an L-shape, so that a slit 94S is formed between the flow regulation plate 36A. In addition, the evacuation nozzle 93 is connected to the evacuation pipe 63 that evacuates the inside of the vacuum chamber 1 through the evacuation nozzle 93. With this, the inside space defined by the partition wall 94 can be evacuated. Therefore, a pressure of an area outside of the slit 94S of the partition wall 94 can be lower, which creates a space toward which the separation gas is likely to flow. Accordingly, the separation gas is likely to be guided toward the space, so that the reaction gas is not likely to be diluted by the separation gas in the first space S1 below the flow regulation plates 36A, 36B, thereby improving the adsorption rate and usage rate of the reaction gas.

In addition, as shown in Section (b) of FIG. 21, the partition wall 94 may have an inverse-U shape and arranged away from the base portion 35 of the nozzle cover 34 to create slits 941, 942 in relation to the both side walls of the base portion 35. According to the illustrate example, the slit 941 creates a low pressure space for the separation gas that flows into the space 48 from the separation area D (the convex portion 4) located upstream relative to the rotation direction of the turntable 2 in relation to the reaction gas nozzle 31, and the slit 942 creates a low pressure space for the separation gas that flows into the space 48 from the separation area D (the convex portion 4) located downstream relative to the rotation direction of the turntable 2 in relation to the reaction gas nozzle 31. With these configurations, dilution of the reaction gas below the flow regulation plates 36A, 36B is sufficiently suppressed, thereby improving the adsorption rate and usage rate of the reaction gas.

Incidentally, the evacuation nozzles 91, 92, 93 may be connected to another evacuation apparatus rather than the evacuation pipe 63 that evacuates the inside of the vacuum chamber 1.

Figure 22:
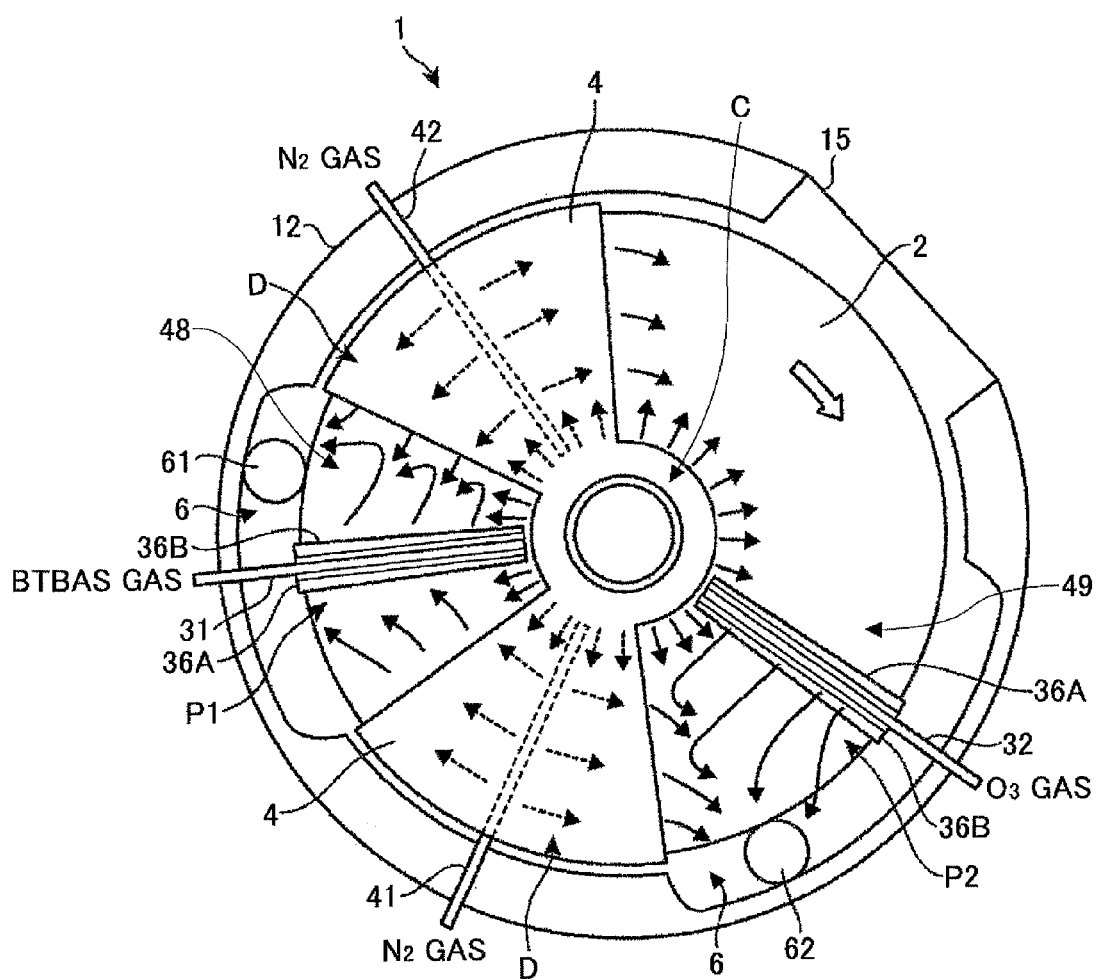
FIG. 22 is a plan view illustrating an layout of reaction gas nozzles in a film deposition apparatus according to an embodiment of the present invention.

Another example of a layout of the reaction gas nozzles 31, 32, the nozzle cover 34, and the separation area D is explained. Referring to FIG. 22, the reaction gas nozzle 32 is located downstream relative to the rotation direction of the turntable 2 in relation to the transfer opening 15 of the chamber body 12. Even with this configuration, the same effect as that explained above can be provided.

Figure 23:
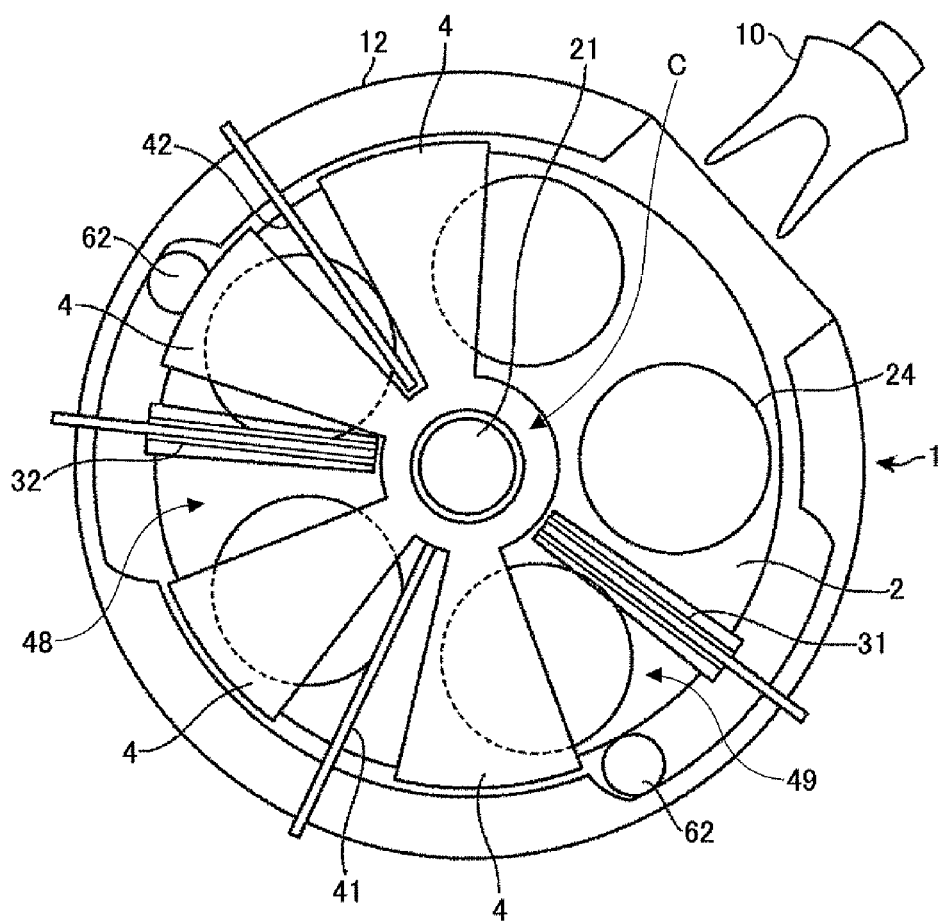
FIG. 23 is a plan view of another example of a convex portion of a film deposition apparatus according to an embodiment of the present invention.

In addition, the separation area D is configured by forming the groove portion 43 in a sector-shaped plate to be the convex portion 4, and arranging the separation gas nozzle 41 (42) in the groove portion 43 in the above embodiments. However, two sector-shaped plates may be attached on the bottom surface of the ceiling plate 11 by screws so that the two sector-shaped plates are located with one plate on each side of the separation gas nozzle 41 (32), as shown in FIG. 23. In this case, a distance between the convex portion 4 and the separation gas nozzle 41 (42), and a size of the convex portion 4 may be determined taking into consideration ejection rates of the separation gas and the reaction gases, in order to effectively demonstrate the separation effect by the separation areas D.

Incidentally, three or more of the reaction gases may be provided rather than the two reaction gas nozzles 31, 32. When three or more reaction gases are supplied toward the wafers, a first reaction gas nozzle, a separation gas nozzle, a second reaction gas nozzle, a separation gas nozzle, a third reaction gas nozzle and a separation gas nozzle may be located in this order at predetermined angular intervals, and the separation areas D including the corresponding separation gas nozzles are configured in the same manner as explained above.

An example of the process conditions is as follows. The rotation speed of the turntable 2 is, for example, 1 through 500 revolutions per minute when the wafer W having a diameter of 300 mm is processed; a temperature of the wafer W is, for example, 350° C.; the process pressure is, for example, 1067 Pa (8 Torr); a flow rate of the BTBAS gas is, for example, 100 scan; a flow rate of the $O_3$ gas is, for example, 10000 sccm; flow rates of the $N_2$ gas from the separation gas nozzles 41, 42 are, for example, 20000 sccm; and a flow rate of the $N_2$ gas from the separation gas supplying pipe 51 is, for example, 5000 sccm. In addition, the cycle number, which is the number of times which the wafer W passes through the first process area P1, the second process area 22, and the irradiation area P3, is, for example, 6000, although it depends on a target thickness of the silicon oxide film.

Figure 24:
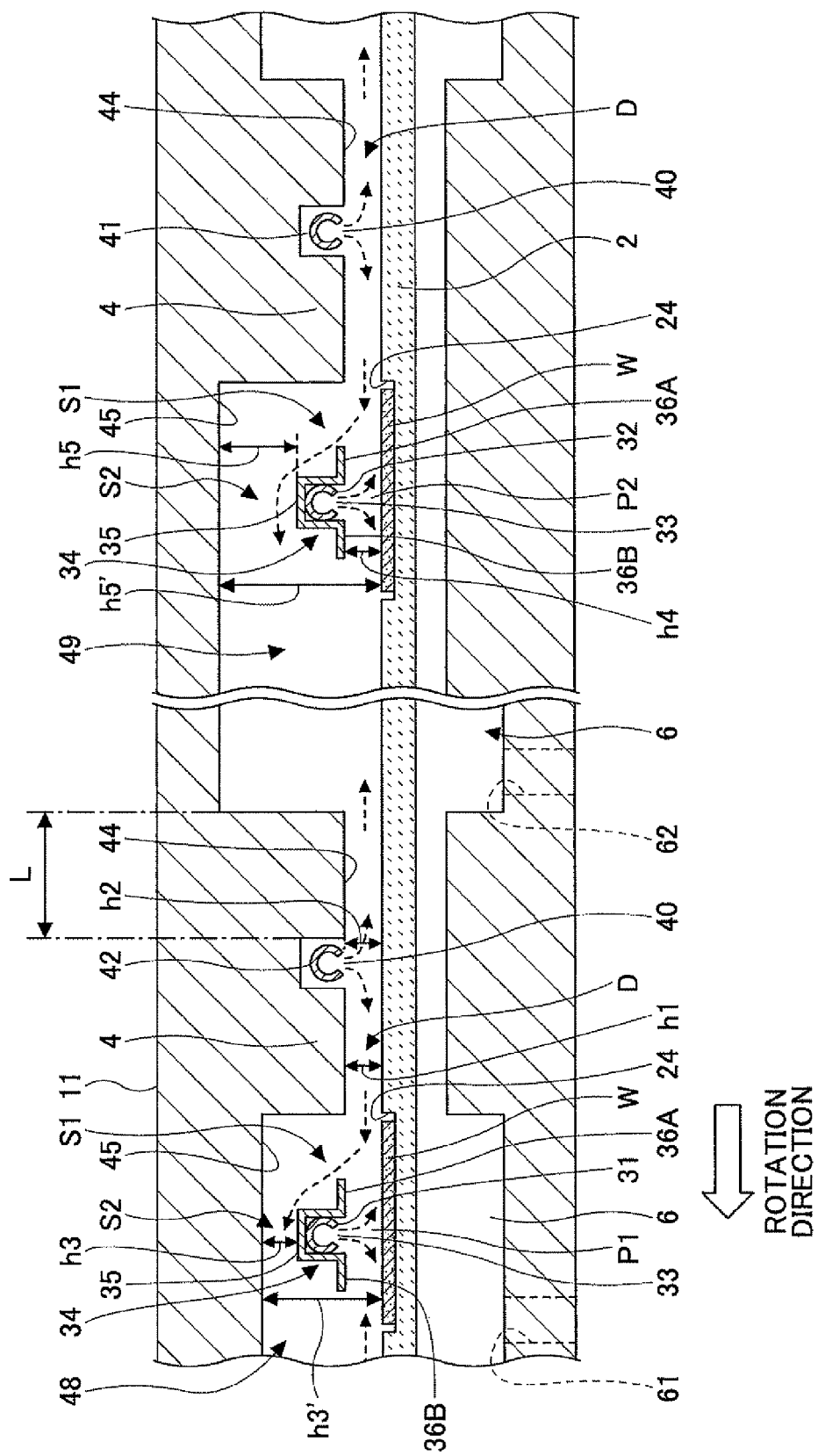
FIG. 24 is a schematic view illustrating a modification of a film deposition apparatus according to an embodiment of the present invention.

Incidentally, when the flow rate of the BTBAS gas is fairly low compared to that of the $O_3$ gas as described above, the ceiling surface 45 above the reaction gas nozzle 31, which supplies the BTBAS gas, may be lower than the ceiling surface 44 above the reaction gas nozzle 32, which supplies the $O_3$ gas. With this, a concentration of the BTBAS gas cannot be extremely low in the space 49 shown in FIG. 24. In addition, even in this case, the nozzle cover 34 is arranged so that the distance h3 (FIG. 24) between the ceiling plate 45 and the upper end of the base portion 35 of the nozzle cover 34 is sufficiently greater than the height h4 of the flow regulation plates 35A, 36B from the upper surface of the turntable 2. As a specific example, when the distance h3' between the upper surface of the turntable 2 and the ceiling surface 45 in the space 49 may be, for example, 15 mm through 100 mm, the height h4 between the upper surface 45 and the ceiling surface 45 may be, for example, 0.5 mm through 4 mm, and the distance h3 between the upper end of the base portion 35 of the nozzle cover 34 and the ceiling surface 45 may be, for example, 10 mm through 70 mm.

Figure 25:
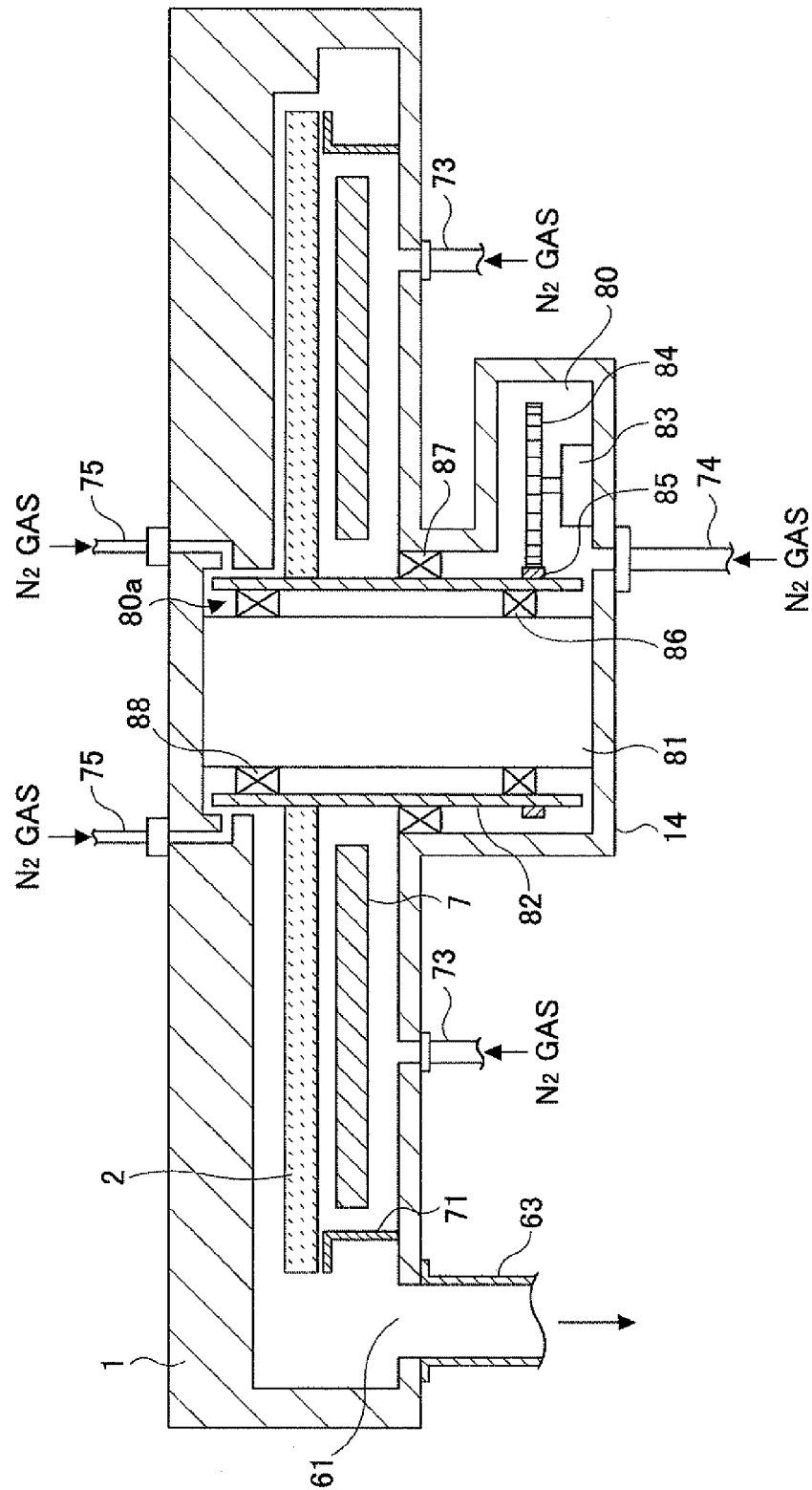
FIG. 25 is a cross-sectional view illustrating a film deposition apparatus according to another embodiment of the present invention.

In the above embodiments, the rotational shaft 22 for rotating the turntable 2 is located in the center portion of the chamber 1. In addition, the space 52 between the core portion 21 and the ceiling plate 11 is purged with the separation gas. However, the vacuum chamber 1 may be configured as shown in FIG. 25 in other embodiments. Referring to FIG. 25, the bottom portion 14 of the chamber body 12 has a center opening and a housing case 80 is attached to the bottom portion 14 in order to close the center opening. Additionally, the ceiling plate 11 has a center concave portion 80a. A pillar 81 is placed on the bottom surface of the housing case 80, and a top end portion of the pillar 81 reaches a bottom surface of the center concave portion 80a. The pillar 81 can impede the first reaction gas (BTBAS) ejected from the first reaction gas nozzle 31 and the second reaction gas ($O_3$) ejected from the second reaction gas nozzle 32 from being intermixed through the center portion of the vacuum chamber 1.

In addition, a rotation sleeve 82 is provided in order to coaxially surround the pillar 81. The rotation sleeve 82 is supported by bearings 86, 88 attached on the outer surface of the pillar 81 and a bearing 87 attached on the inner circumferential surface of the housing case 80. Additionally, a gear 85 is attached on the rotation sleeve 82. Moreover, a driving portion 83 is housed in the housing case 80, and a gear 84 is attached to a shaft extending from the driving portion 83. The gear 84 is meshed with the gear 85, so that the rotation sleeve 82 and thus the turntable 2 can be rotated by the driving portion 83.

A purge gas supplying pipe 74 is connected to the bottom of the housing case 80, so that a purge gas is supplied into the housing case 80. With this, the inside space of the housing case 80 can be maintained at higher temperatures than the inner space of the vacuum chamber 1 in order to substantially prevent the reaction gas from flowing into the housing case 80. Therefore, no film deposition takes place in the housing case 80 and thus maintenance frequency can be reduced. In addition, purge gas supplying pipes 75 are connected to corresponding conduits 75a reaching from the upper outside surface of the vacuum chamber 1 to the inner wall of the concave portion 80a, and thus purge gas is supplied to the upper end portion of the rotation sleeve 82. With this purge gas, the BTBAS gas and the $O_3$ gas are not intermixed through a space between the inner wall of the concave portion 80a and the outer circumferential surface of the turntable 2. While two purge gas supplying pipes 75 and the two conduits 75a are illustrated, the number of the purge gas supplying pipes 75 and the number of the conduits 75a may be determined so that the intermixture of the BTBAS gas and the $O_3$ gas is surely avoided through the space between the inner wall of the concave portion 80a and the outer circumferential wall of the turntable 2.

In the embodiment illustrated in FIG. 25, a space between the side wall of the concave portion 80a and the upper end portion of the rotation sleeve 82 corresponds to the ejection hole for ejecting the separation gas. In addition, the center area is configured with the ejection hole, the rotation sleeve 82, and the pillar 81.

Even in the film deposition apparatus having the above configuration according to an embodiment of the present invention, at least one of the reaction gas nozzles 31, 32 is provided with the nozzle cover 34. Therefore, the same effect as explained above can be provided even in this film deposition apparatus.

Figure 26:
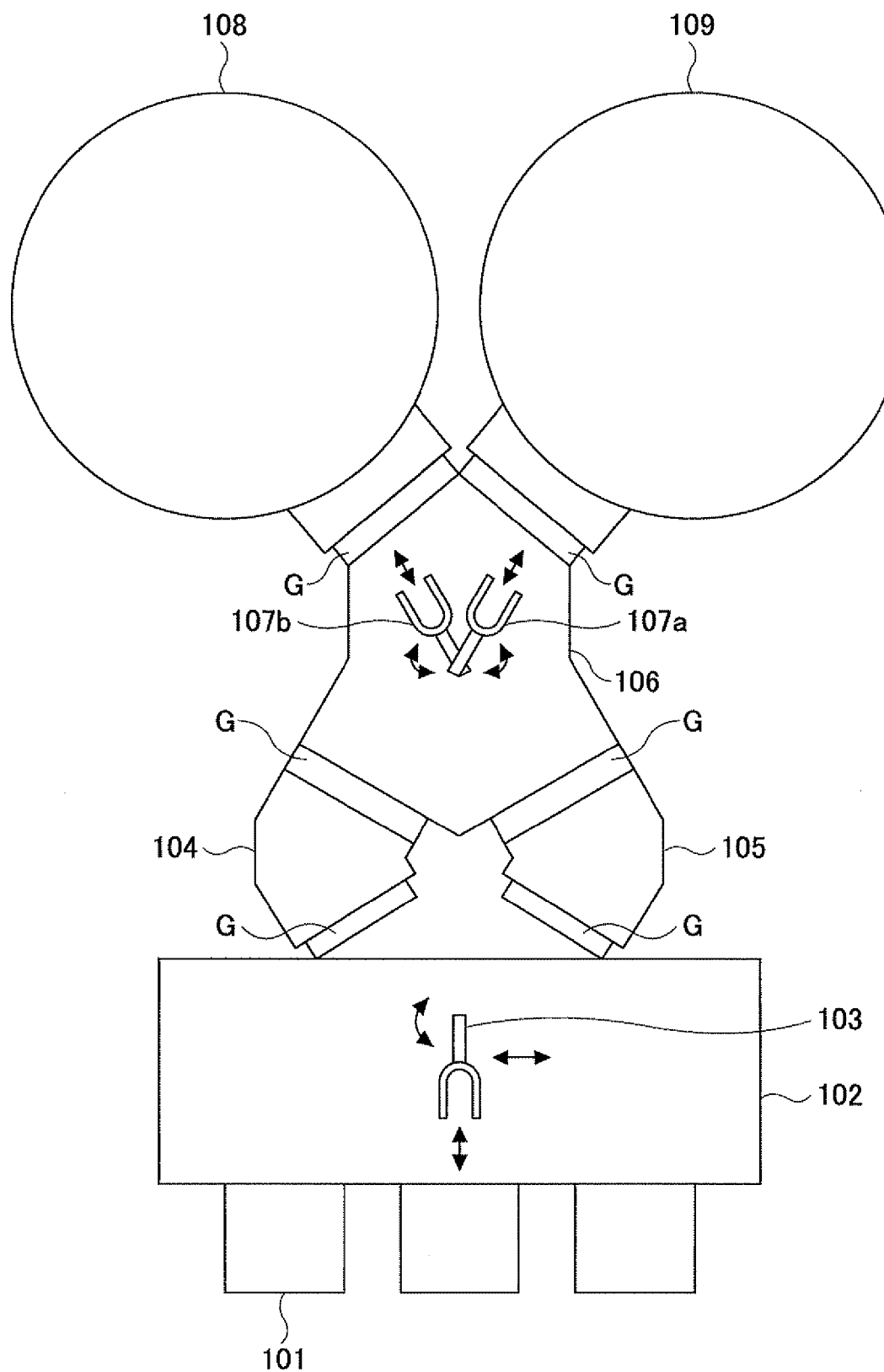
FIG. 26 is a schematic view illustrating a wafer process apparatus including a film deposition apparatus, according to an embodiment of the present invention.

The film deposition apparatuses according to embodiments of the present invention (including the modifications) may be integrated into a wafer process apparatus, an example of which is schematically illustrated in FIG. 26. The wafer process apparatus includes an atmospheric transfer chamber 102 in which a transfer arm 103 is provided, a load lock chamber (preparation chamber) 104 (or 105) whose atmosphere is changeable between vacuum and atmospheric pressure, a vacuum transfer chamber 106 in which two transfer arms 107a, 107b are provided, and film deposition apparatuses 108, 109 according to embodiments of the present invention. In addition, the wafer process apparatus includes cassette stages (not shown) on which a wafer cassette 101 such as a Front Opening Unified Pod (FOUP) is placed. The wafer cassette 101 is brought onto one of the cassette stages, and connected to a transfer in/out port provided between the cassette stage and the atmospheric transfer chamber 102. Then, a lid of the wafer cassette (FOUP) 101 is opened by an opening/closing mechanism (not shown) and the wafer is taken out from the wafer cassette 101 by the transfer arm 103. Next, the wafer is transferred to the load lock chamber 104 (or 105). After the load lock chamber 104 (or 105) is evacuated, the wafer in the load lock chamber 104 (or 105) is transferred further to one of the film deposition apparatuses 108, 109 through the vacuum transfer chamber 106 by the transfer arm 107a (or 107b). In the film deposition apparatus 108 (or 109), a film is deposited on the wafer in such a manner as described above. Because the wafer process apparatus has two film deposition apparatuses 108, 109, each of which can house five wafers at a time, the ALD (or MU) mode deposition can be performed at high throughput.

Moreover, reaction gases that may be used in the film deposition apparatus according to embodiments of the present invention are dichlorosilane (DCS), hexadichlorosilane (HCD), trymethylaluminum (TMA), tris(dimethylamino)silane (3DMAS), tetrakis(ethylmethylamino)zirconium (TEMAZ), tetrakis (ethylmethylamino)hafnium (TEMAH), bis (tetra methyl heptandionate) strontium $(Sr(THD)_2)$ (methyl-pentadionate) (bis-tetra-methyl-heptandionate) titanium $(Ti(MPD)(THD)_2)$ monoaminosilne and the like, in addition to the above-mentioned reaction gases.

(Evaluation Test 1)

Figure 27:
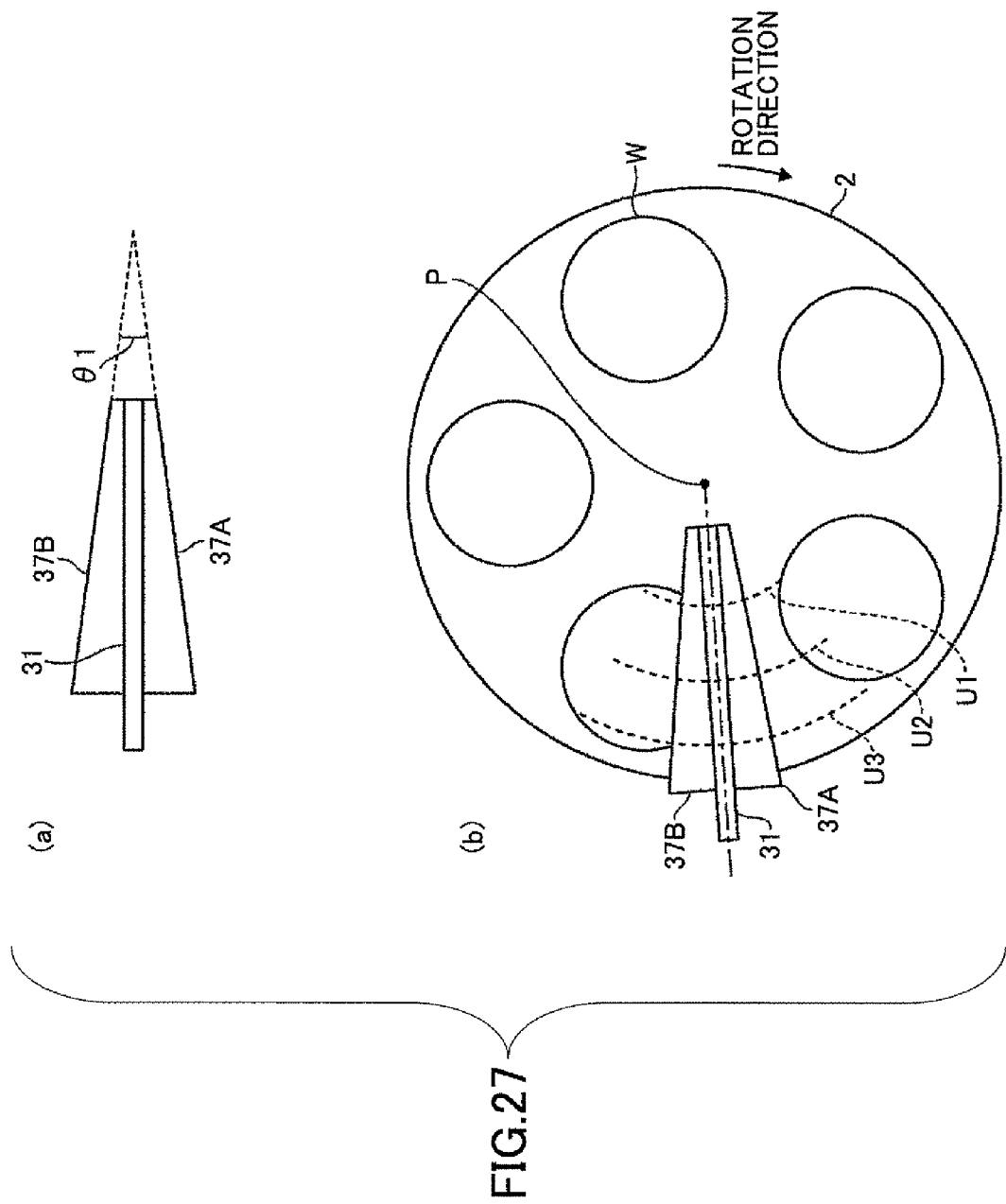
FIG. 27 illustrates a model used for computer simulation carried out to verify an effect caused by a film deposition apparatus according to an embodiment of the present invention.
Figure 28:
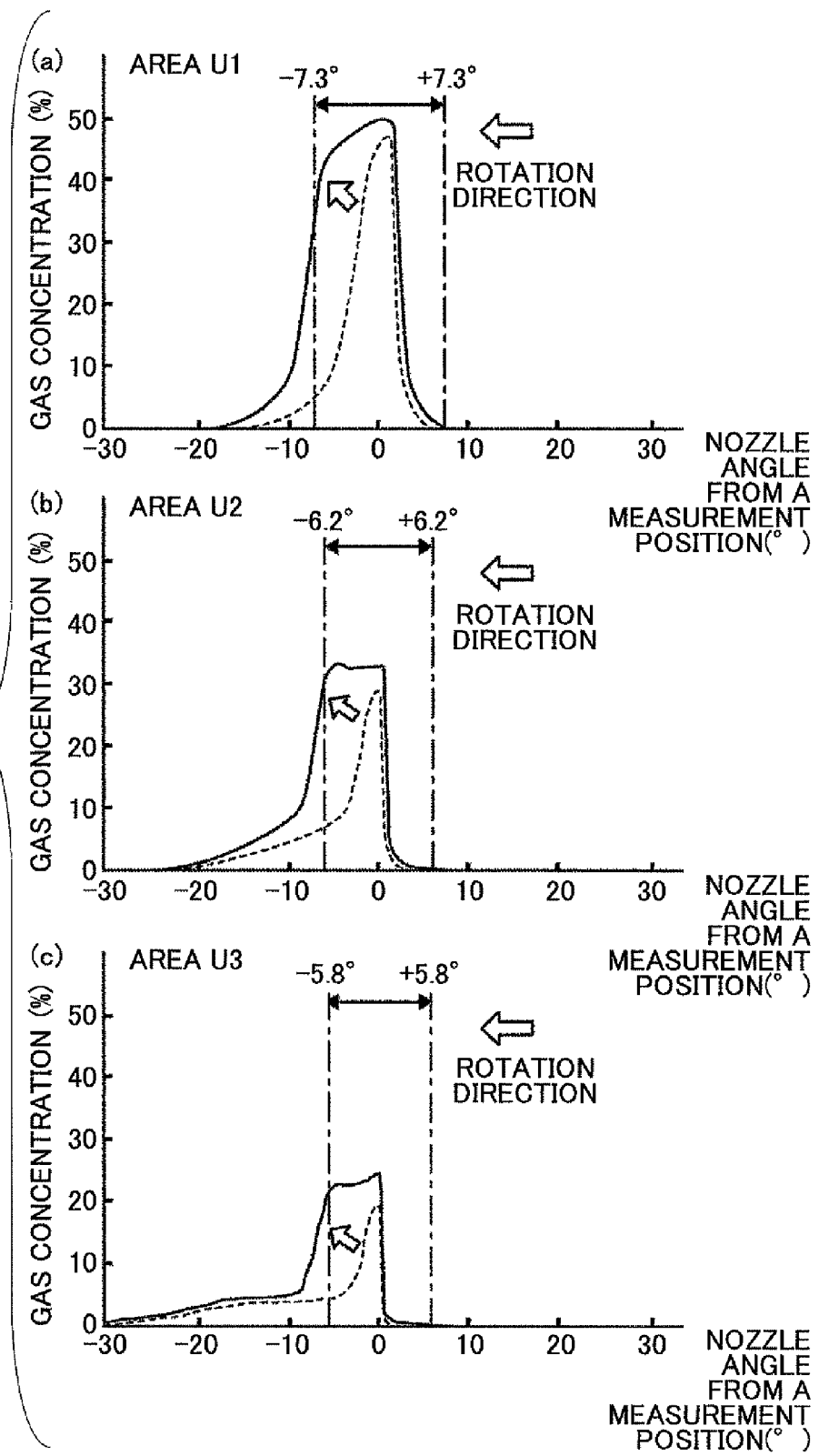
FIG. 28 illustrates graphs of the simulation results.

Computer simulation was carried out in order to verify the effect of the embodiment according to the present invention. As a model for this computer simulation, the reaction gas nozzles 31, 32 having the flow regulation plates 37A, 37B, which have been explained with reference to FIG. 17, are used, as shown in FIG. 27. An angle θ1 between extended lines along the sides of the flow regulation plates 37A, 37B were set to be 10°. In addition, a reaction gas concentration is obtained in regions U1, U2, U3 shown by dotted lines in Section (b) of FIG. 27. The regions U1, U2, and U3 are away from the center point P of the turntable 2 by 160 mm, 310 mm, and 460 mm, respectively. Moreover, arc lengths of the regions U1, U2, U3 correspond to a center angle +/−30° in relation to a reference axis that is shown by a broken line in the drawing and extends along the longitudinal direction of the reaction gas nozzle 31. The rotation speed of the turntable 2 is 120 revolutions per minute.

For comparison, computer simulation was carried out using a reaction gas nozzle without the flow regulation plates 37A, 37B as a model. The areas where the reaction gas concentration is obtained and the rotation speed of the turntable 2 are the same as the above.

Sections (a) through (c) illustrate measurement results in the regions U1, U2, U3. A vertical axis in each graph represents a gas concentration (%) of the reaction gas in each measurement points, and a horizontal axis represents the measurement points. Incidentally, the horizontal axis represents an angle from the reference axis, where a "+" direction indicates an upstream direction relative to the rotation direction of the turntable 2, and a "−" direction indicates a downstream direction relative to the rotation direction of the turntable 2. In each graph, solid lines indicate results in a case where the flow regulation plates 37A, 37B are provided, and dotted lines indicate results in a case where the flow regulation plates 37A, 37B are not provided. In addition, in each graph, two dot-chain lines indicate a range from −7.3° to +7.3° in relation to the reference line in the region U1, a range from −6.2° to +6.2° in relation to the reference line in the region U2, and a range from −5.8° to +5.8° in relation to the reference line in the region U3.

As clearly understood from each graph, the reaction gas concentration in an area located downstream relative to the rotation direction of the turntable 2 in relation to the reaction gas nozzle 31 becomes increased in each region where the flow regulation plates 37A, 37B are provided, compared to a case where the flow regulation plates 37A, 37B are not provided. Therefore, the effects of the embodiments according to the present invention were verified from the results of the evaluation test 1.

(Evaluation Test 2)

Figure 29:
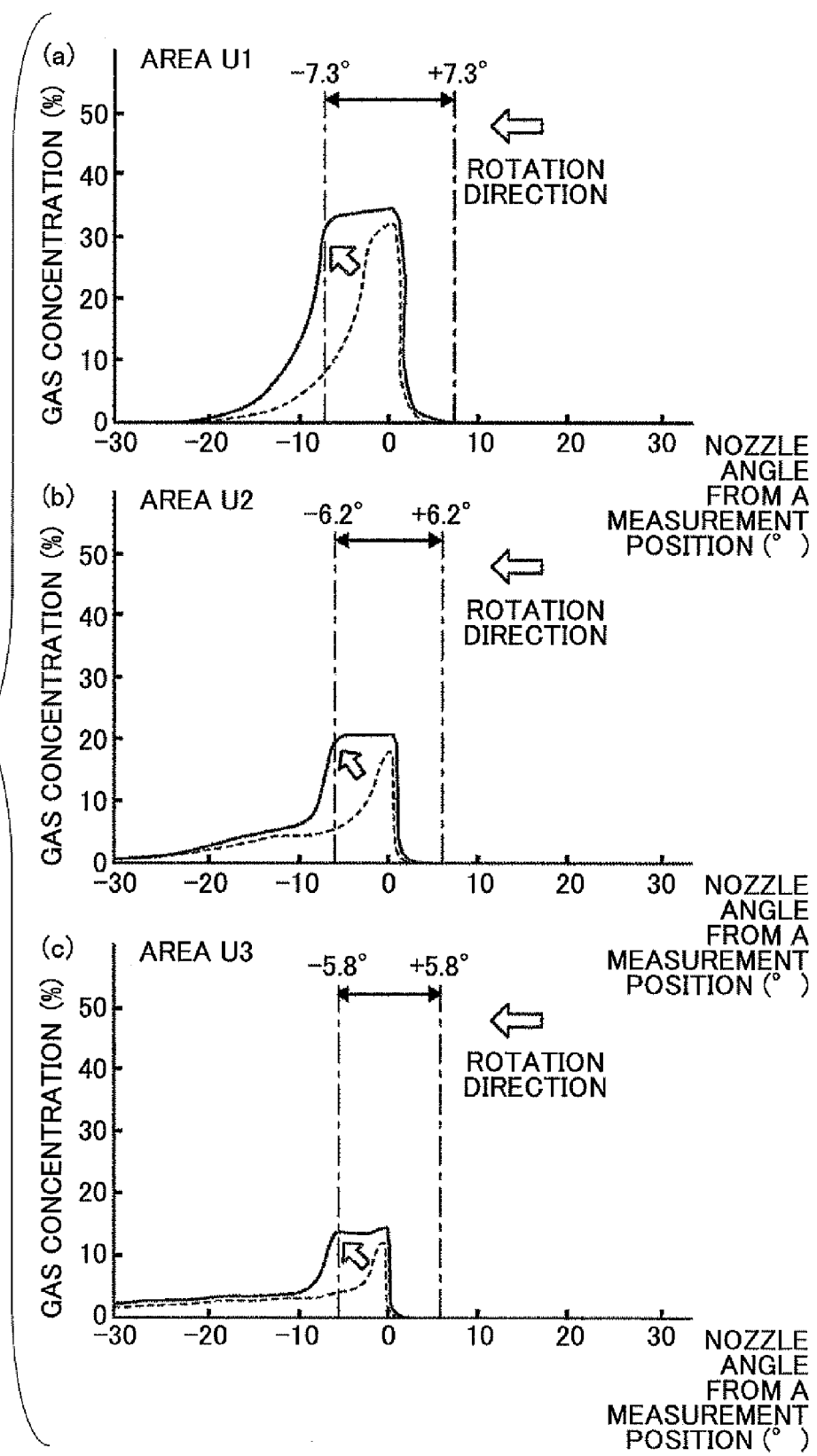
FIG. 29 illustrates other graphs of the simulation results.

Next, the computer simulation was carried out with the simulation conditions same as the above, except for the rotation speed of 240 rpm of the turntable 2. Sections (a) through (c) of FIG. 29 illustrate the results in the corresponding regions U1, U2, U3. As shown in these graphs, the reaction gas concentration is increased in an area located downstream relative to the rotation direction of the turntable 2 in relation to the reaction gas nozzle 31 in each measurement regions by using the flow regulation plates 37A, 37B. Therefore, it has been found from the results of the evaluation test 2 that use of the flow regulation plates 37A, 37B is effective even at an increased rotation speed of the turntable 2 to maintain an increased reaction gas concentration.

(Evaluation Test 3)

A distribution of a thickness of a silicon oxide film deposited by the film deposition apparatus according to embodiments of the present invention is investigated. Specifically, the film thickness distributions were taken along the radius direction of the turntable 2 from the center to the circumference of the turntable 2 shown by a dotted line as shown in Section (a) of FIG. 30. In addition, the film thickness distributions were taken for the reaction gas nozzles 31, 32 to which the corresponding nozzle covers 34 are attached and the reaction gas nozzle 31, 32 to which no nozzle covers 34 are attached. Incidentally, the rotation speed of the turntable 2 was 240 rpm and a temperature of the turntable 2 was 350° C.

Figure 30:
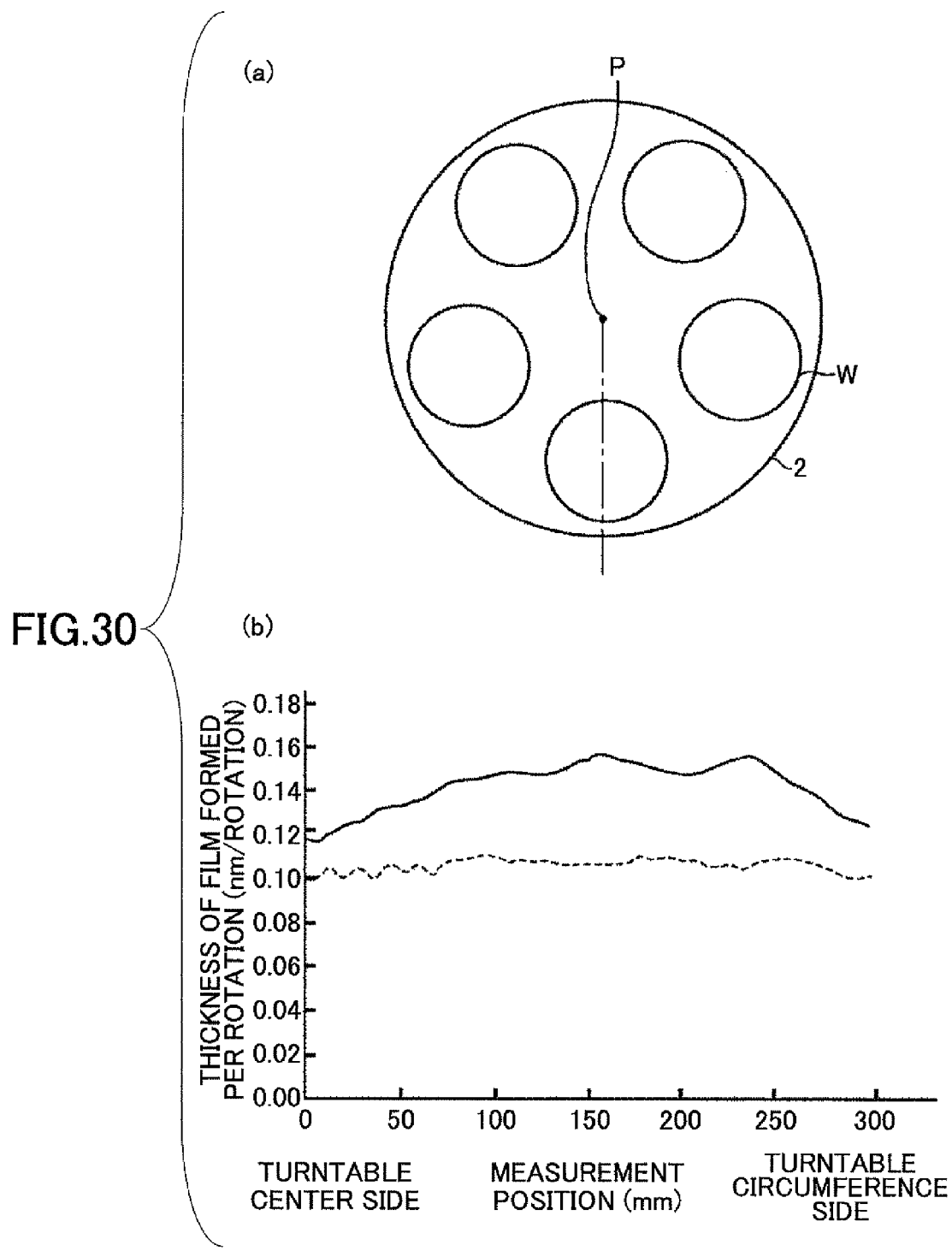
FIG. 30 is an explanatory view illustrating a range with respect to which computer simulation is carried out on a film thickness of a film deposited on a wafer, and results of the simulation.

Section (b) of FIG. 30 illustrates a graph of the measurement results of the film thickness distribution. The vertical axis represents a deposition thickness per rotation (a value obtained by dividing a film thickness of the total deposited film by the number of the total rotations), and the horizontal axis represents measurement points. The center P of the turntable 2 corresponds to the origin (0 mm) and the circumferential edge of the turntable 2 corresponds to a position of 300 mm. In addition, solid lines in the graph indicate the results when the flow regulation plates 36A, 36B are provided, and dotted lines indicate the results when the flow regulation plates 36A, 36B are not provided.

From the result shown in the graph, it has been found that the film thickness per rotation was increased in every measurement points when the flow regulation plates 36A, 365 are used. This result may indicate that sufficient film deposition rate can be realized even when the rotation speed of the turntable 2 is further increased, thereby increasing throughput. Incidentally, while the graph indicates that film thickness uniformity is slightly degraded by using the flow regulation plates 36A, 36B, the film thickness uniformity can be improved by adjusting shapes of the ejection holes 33 of the reaction gas nozzles 31, 32 and intervals of the ejection holes 33.

(Evaluation Test 4)

Next, computer simulation was carried out for the reaction gas concentration when the reaction gas nozzle 31 with the flow regulation plates 37A, 37B is used, and the reaction gas nozzle without the flow regulation plates 37A, 37B is used, using the same conditions as those in Evaluation test 1.

Figure 31:
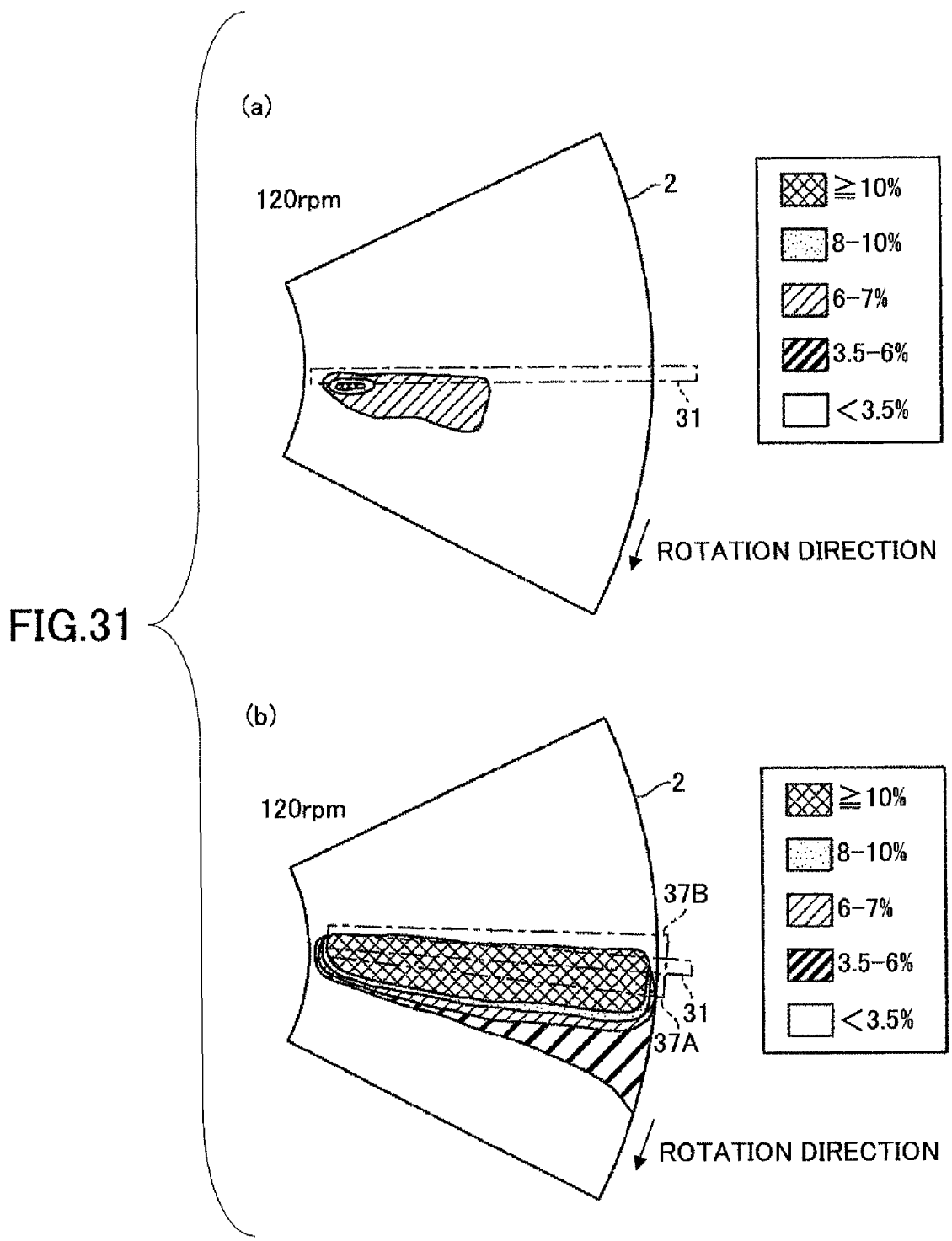
FIG. 31 illustrates graphs illustrating results of computer simulation carried out on a gas concentration in a vacuum chamber of a film deposition apparatus according to an embodiment of the present invention.

Section (a) of FIG. 31 illustrates a distribution of the reaction gas concentration when the flow regulation plates 37A, 37B were not used, and Section (b) of FIG. 31 illustrates a distribution of the reaction gas concentration when the flow regulation plates 37A, 37B were used. As clearly understood by comparing the Sections (a) and (b) of FIG. 31, an atmosphere having high reaction gas concentration is creased around the reaction gas nozzle 31 when the flow regulation plates 37A, 37B were used, compared to a case where the flow regulation plates 37A, 375 are not used. Namely, the effects of the film deposition apparatus according to embodiments of the present invention have been verified.

(Evaluation Test 5)

Figure 32:
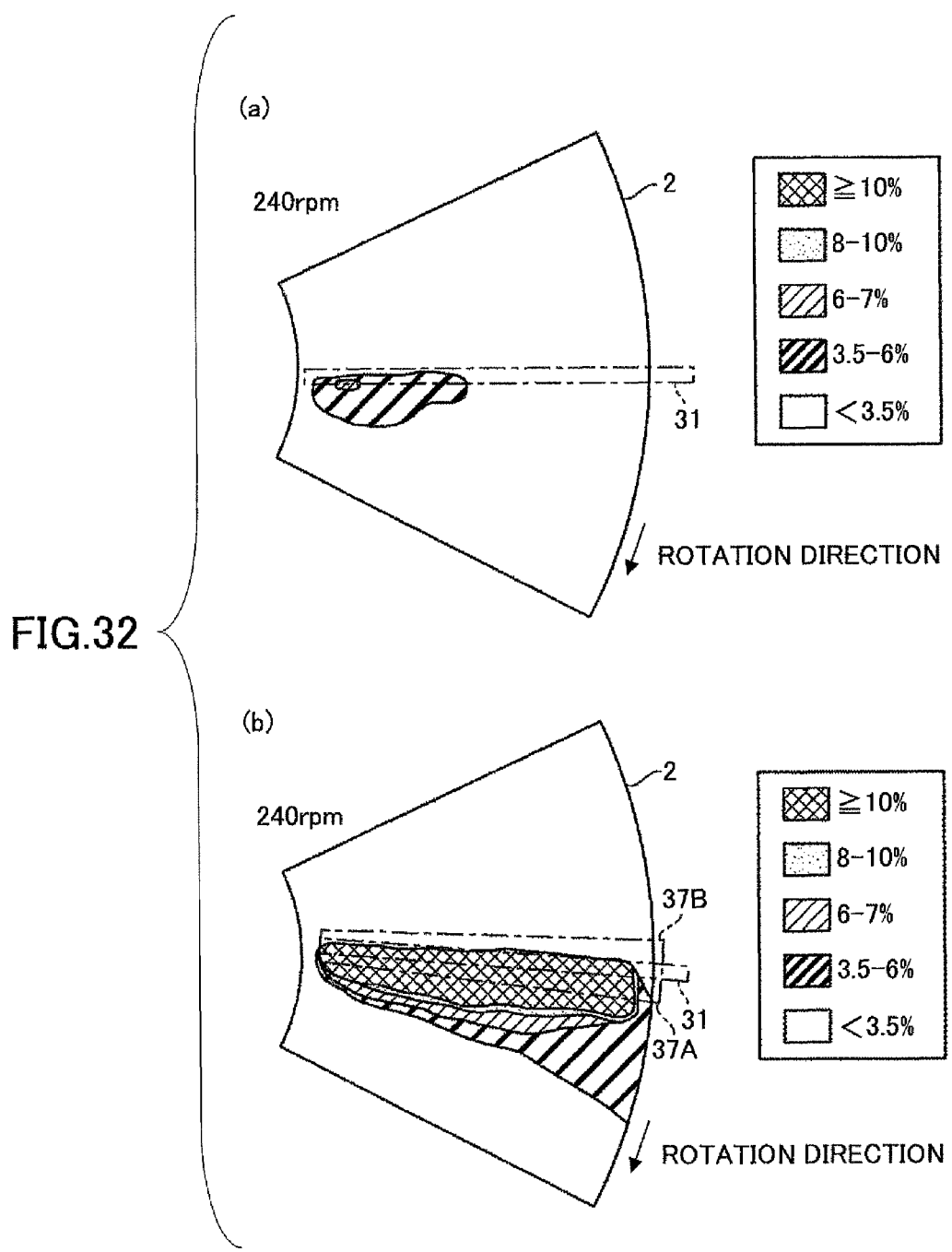
FIG. 32 illustrates graphs illustrating results of computer simulation carried out on a gas concentration in a vacuum chamber of a film deposition apparatus according to an embodiment of the present invention.

Finally, the computer simulation was carried out with the same conditions as those of Evaluation test 4, except the rotation speed of the turntable 2 was 240 rpm. Section (a) of FIG. 32 indicates the result when the flow regulation plates 37A, 37B were not used, and Section (b) of FIG. 32 indicates the result when the flow regulation plates 37A, 37B were used. As clearly understood by comparing Sections (a) and (b) of FIG. 32, the reaction gas concentration around the reaction gas nozzle 31 is increased by using the flow regulation plates 37A, 37B. Therefore, it has been found that an area having a high reaction gas concentration can be created around the reaction gas nozzle 31 even when the rotation speed of the turntable 2 is increased, which is indicative of the effects of the film deposition apparatus according to embodiments of the present invention.

Although the invention has been described in conjunction with the foregoing specific embodiment, many alternatives, variations and modifications within the scope of the appended claims will be apparent to those of ordinary skill in the art.

What is claimed is:

1. A film deposition apparatus for depositing a film on a substrate by performing a cycle of alternately supplying at least two kinds of reaction gases that react with each other to the substrate to produce a layer of a reaction product, the film deposition apparatus comprising:
    a vacuum chamber including a ceiling portion;
    a turntable that is rotatably provided in the vacuum chamber and has on a first surface a substrate receiving area in which the substrate is placed;
    a first reaction gas nozzle with an ejection hole provided to extend along a radial direction of the turntable and to supply a first reaction gas to the first surface of the turntable and;
    a second reaction gas nozzle with an ejection hole provided to extend along the radial direction of the turntable away from the first reaction gas nozzle along a rotation direction of the turntable and to supply a second reaction gas to the first surface of the turntable;
    a separation gas nozzle with an ejection hole provided to extend along the radial direction of the turntable between the first reaction gas nozzle and the second reaction gas nozzle and to supply a separation gas that separates the first reaction gas and the second reaction gas, the separation gas nozzle providing a separation area between the first reaction gas nozzle and the second reaction gas nozzle;
    an evacuation port that evacuates the chamber; and
    a nozzle cover provided for the first reaction gas nozzle to create:
        a first space that is below the nozzle cover and that is between the nozzle cover and the turntable in which the ejection hole of the first reaction gas nozzle exists; and
        a second space that is above the first reaction gas nozzle and the nozzle cover and that is between the nozzle cover and the ceiling portion such that the separation gas from the separation gas area is impeded from flowing into the first space and the separation gas is likely to flow through the second space rather than the first space.

2. The film deposition apparatus of claim 1, wherein the nozzle cover includes a first flow regulation plate provided between the first reaction gas nozzle and the separation gas nozzle and extending along the first reaction gas nozzle in a longitudinal direction of the first reaction gas nozzle to create the first space and the second space.

3. The film deposition apparatus of claim 1, further comprising an evacuation portion that allows the separation gas to tend to flow to the second space rather than the first space by evacuation.

4. The film deposition apparatus of claim 3, wherein the evacuation portion includes a first evacuation nozzle provided in the second space and is introduced into the chamber through the ceiling portion of the chamber.

5. The film deposition apparatus of claim 3, wherein the evacuation portion includes a second evacuation nozzle provided in the second space and is provided along the first reaction gas nozzle nozzle that has the nozzle.

6. The film deposition apparatus of claim 5, wherein the second evacuation nozzle goes through a side portion of the chamber.

7. The film deposition apparatus of claim 3, wherein the evacuation portion includes
    a partition wall provided in the second space and forms a gas flow passage between at least a part of an upper surface of the nozzle cover and the partition wall; and
    a third evacuation nozzle that is introduced into the chamber through the ceiling portion of the chamber and is gaseous communication with the gas flow passage.

8. The film deposition apparatus of claim 1, wherein the ceiling portion is provided with a convex portion with a low ceiling surface to provide the separation area,
    the low ceiling surface having a height from the turntable being determined so that the first reaction gas and the second reaction gas are impeded from flowing into a space between the low ceiling surface and the turntable.

9. The film deposition apparatus of claim 1, wherein the ceiling portion is provided with a convex portion with a low ceiling surface to provide the separation area.

10. The film deposition apparatus of claim 2, wherein the first flow regulation plate is arranged upstream relative to the rotation direction of the turntable in relation to the first reaction gas nozzle.

11. The film deposition apparatus of claim 10, wherein the nozzle cover further includes a second flow regulation plate arranged downstream of the rotation direction of the turntable in relation to the first reaction gas nozzle.

12. The film deposition apparatus of claim 2, wherein the first flow regulation plate is provided such that the length of the flow regulation plate in the rotation direction of the turntable becomes longer in a direction from the center to the circumference of the turntable.

13. The film deposition apparatus of claim 2, wherein the first flow regulation plate is provided to be parallel with the first surface of the turntable.

14. The film deposition apparatus of claim 2, wherein the first flow regulation plate is provided to be inclined with respect to the first surface of the turntable such that the distance from the first surface of the turntable to the first flow regulation plate becomes smaller as closer to the separation gas nozzle.

15. The film deposition apparatus of claim 2, wherein the first flow regulation plate is attached to the first reaction gas nozzle.

16. The film deposition apparatus of claim 2, wherein the nozzle cover further includes a base portion that covers the first reaction gas nozzle and the first flow regulation plate is attached to the base portion.

* * * * *